United States Patent
Lee

(10) Patent No.: US 9,305,933 B2
(45) Date of Patent: Apr. 5, 2016

(54) METHODS OF FORMING SEMICONDUCTOR MEMORY DEVICES

(71) Applicant: Samsung Electronics Co., Ltd., Suwon-si, Gyeonggi-do (KR)

(72) Inventor: Jaegoo Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/516,996

(22) Filed: Oct. 17, 2014

(65) Prior Publication Data
US 2015/0037949 A1    Feb. 5, 2015

Related U.S. Application Data

(62) Division of application No. 13/478,678, filed on May 23, 2012, now Pat. No. 8,872,253.

(30) Foreign Application Priority Data

May 24, 2011 (KR) .................. 10-2011-0048962

(51) Int. Cl.
*H01L 29/792* (2006.01)
*H01L 27/115* (2006.01)
*G11C 16/04* (2006.01)

(52) U.S. Cl.
CPC ...... *H01L 27/11563* (2013.01); *G11C 16/0408* (2013.01); *G11C 16/0483* (2013.01); *H01L 27/1157* (2013.01); *H01L 27/11582* (2013.01); *H01L 27/11524* (2013.01); *H01L 27/11556* (2013.01)

(58) Field of Classification Search
USPC .................................................. 257/296–310
See application file for complete search history.

(56) References Cited

U.S. PATENT DOCUMENTS

| | | | |
|---|---|---|---|
| 4,896,149 A | 1/1990 | Buzak et al. | |
| 6,870,215 B2 | 3/2005 | Endoh et al. | |
| 8,507,972 B2* | 8/2013 | Oota ................. | H01L 27/11573 257/319 |
| 2008/0179659 A1 | 7/2008 | Enda et al. | |
| 2009/0278193 A1* | 11/2009 | Murata ............. | H01L 27/11551 257/324 |
| 2010/0140684 A1 | 6/2010 | Ozawa | |
| 2010/0163968 A1 | 7/2010 | Kim et al. | |
| 2010/0213527 A1 | 8/2010 | Shim et al. | |
| 2010/0213537 A1* | 8/2010 | Fukuzumi ......... | H01L 27/11578 257/326 |
| 2010/0244119 A1 | 9/2010 | Fukuzumi et al. | |
| 2012/0086072 A1 | 4/2012 | Yun et al. | |

FOREIGN PATENT DOCUMENTS

| | | |
|---|---|---|
| JP | 2010-157734 | 7/2010 |
| JP | 2010-199314 | 9/2010 |
| JP | 2010-225946 | 10/2010 |
| KR | 1020100079393 | 7/2010 |
| KR | 1020100097054 | 9/2010 |
| KR | 1020100106911 | 10/2010 |

* cited by examiner

*Primary Examiner* — Marc Armand
*Assistant Examiner* — Quinton Brasfield
(74) *Attorney, Agent, or Firm* — Myers Bigel Sibley & Sajovec, P.A.

(57) ABSTRACT

Methods of fabricating a semiconductor device are provided. The method includes alternately stacking first material layers and second material layers on a substrate to form a stacked structure, forming a through hole penetrating the stacked structure, forming a data storage layer on a sidewall of the through hole, forming a semiconductor pattern electrically connected to the substrate on an inner sidewall of the data storage layer, etching an upper portion of the data storage layer to form a first recessed region exposing an outer sidewall of the semiconductor pattern, and forming a first conductive layer in the first recessed region. Related devices are also disclosed.

15 Claims, 24 Drawing Sheets

METHODS OF FORMING SEMICONDUCTOR MEMORY DEVICES

CROSS-REFERENCE TO RELATED APPLICATIONS

This application is a divisional of U.S. patent application Ser. No. 13/478,678, filed May 23, 2012 and claims priority from Korean Patent Application No. 10-2011-0048962, filed on May 24, 2011, the disclosure of which is hereby incorporated by reference in its entirety.

BACKGROUND

1. Technical Field

Embodiments herein relates to electronic devices and methods of forming the same and, more particularly, to semiconductor memory devices and methods of forming the same.

2. Description of Related Art

The integration density of the semiconductor memory devices can be a factor that may influence the cost of the semiconductor memory devices. That is, if the integration density of the semiconductor memory devices increases, the cost of the semiconductor memory devices may be lowered. The integration density of semiconductor memory devices, e.g., planar semiconductor memory devices may be mainly determined by a planar area that a unit memory cell occupies. Accordingly, the integration density of the planar semiconductor memory devices may be affected by, e.g., a technology for forming fine and small patterns. However, realizing fine patterns in the planar semiconductor memory devices may result in increasing manufacturing costs and/or high priced apparatuses. Therefore, there may be some limitations in forming the small and fine patterns.

Recently, three dimensional semiconductor devices including memory cells arranged in a three dimensional array have been proposed to overcome the above limitations.

SUMMARY

Exemplary embodiments are directed to semiconductor memory devices and methods of forming the same.

In an example embodiment, the method includes alternately stacking first material layers and second material layers on a substrate to form a stacked structure, forming a through hole penetrating the stacked structure, forming a data storage layer on a sidewall of the through hole, forming a semiconductor pattern electrically connected to the substrate on an inner sidewall of the data storage layer, etching an upper portion of the data storage layer to form a first recessed region exposing an outer sidewall of the semiconductor pattern, and forming a first conductive layer in the first recessed region.

In some embodiments, the data storage layer may be formed to include a first layer and a second layer that have an etch selectivity with respect to each other. Etching the upper portion of the data storage layer may includes selectively removing an upper portion of the first layer to form a second recessed region exposing a sidewall of the second layer and etching an upper portion of the second layer to expose an outer sidewall of the semiconductor pattern. The second material layer may include a silicon oxide layer, and the first layer may have an etch selectivity with respect to the second material layer.

In some embodiments, the method may further comprise replacing the first material layers with electrode patterns. in this case, etching the upper portion of the data storage layer may be performed so that a top surface of the etched data storage layer is located at a higher level than a top surface of an uppermost one of the electrode patterns.

In some embodiments, the first conductive layer may be a material including metal.

In some embodiments, the method may further include forming a filling insulation layer that fills the through hole surrounded by the semiconductor pattern, etching an upper portion of the filling insulation layer to form a third recessed region in the through hole, and forming a second conductive layer in the third recessed region. The second conductive layer may be formed prior to formation of the first conductive layer.

In some embodiments, forming the data storage layer may include sequentially forming a tunnel insulation layer, a charge storage layer and a blocking insulation layer on a sidewall of the through hole. In this case, etching the upper portion of the data storage layer may include selectively etching an upper portion of the charge storage layer to expose sidewalls of the tunnel insulation layer and the blocking insulation layer, and removing upper portions of the tunnel insulation layer and the blocking insulation layer.

In another example embodiment, the semiconductor memory device includes a substrate, an electrode structure disposed on the substrate, a channel structure penetrating the electrode structure, and a data storage layer between the channel structure and the electrode patterns. The electrode structure includes a plurality of electrode patterns vertically stacked. The channel structure is electrically connected to the substrate. The data storage layer extends along a sidewall of the channel structure. The channel structure includes a conductive pattern in a through hole penetrating the electrode structure, and the conductive pattern extends onto a top surface of the data storage layer.

In some embodiments, a top surface of the data storage layer may be located at a lower level than a top surface of the conductive pattern and at a higher level than a top surface of an uppermost pattern of the electrode patterns.

In some embodiments, the conductive pattern may include a semiconductor pattern contacting the substrate and a first conductive layer surrounding an outer sidewall of the semiconductor pattern. A bottom surface of the first conductive layer may contact a top surface of the data storage layer. The first conductive layer may include metal. A sidewall of the first conductive layer may be vertically aligned with an outer sidewall of the data storage layer. The channel structure may further include a filling insulation pattern that occupies a lower portion of a gap region surrounded by an inner sidewall of the semiconductor pattern. The conductive pattern may further include a second conductive layer that is disposed on the filling insulation pattern to occupy an upper portion of the gap region. Top surfaces of the first and second conductive layers may be coplanar with a top surface of the semiconductor pattern. A bottom surface of the second conductive layer may be located at a higher level than a top surface of an uppermost one of the electrode patterns.

BRIEF DESCRIPTION OF THE DRAWINGS

The above and other features and advantages of the disclosure will become more apparent in view of the attached drawings and accompanying detailed description.

DETAILED DESCRIPTION OF THE EMBODIMENTS

Figure 1:
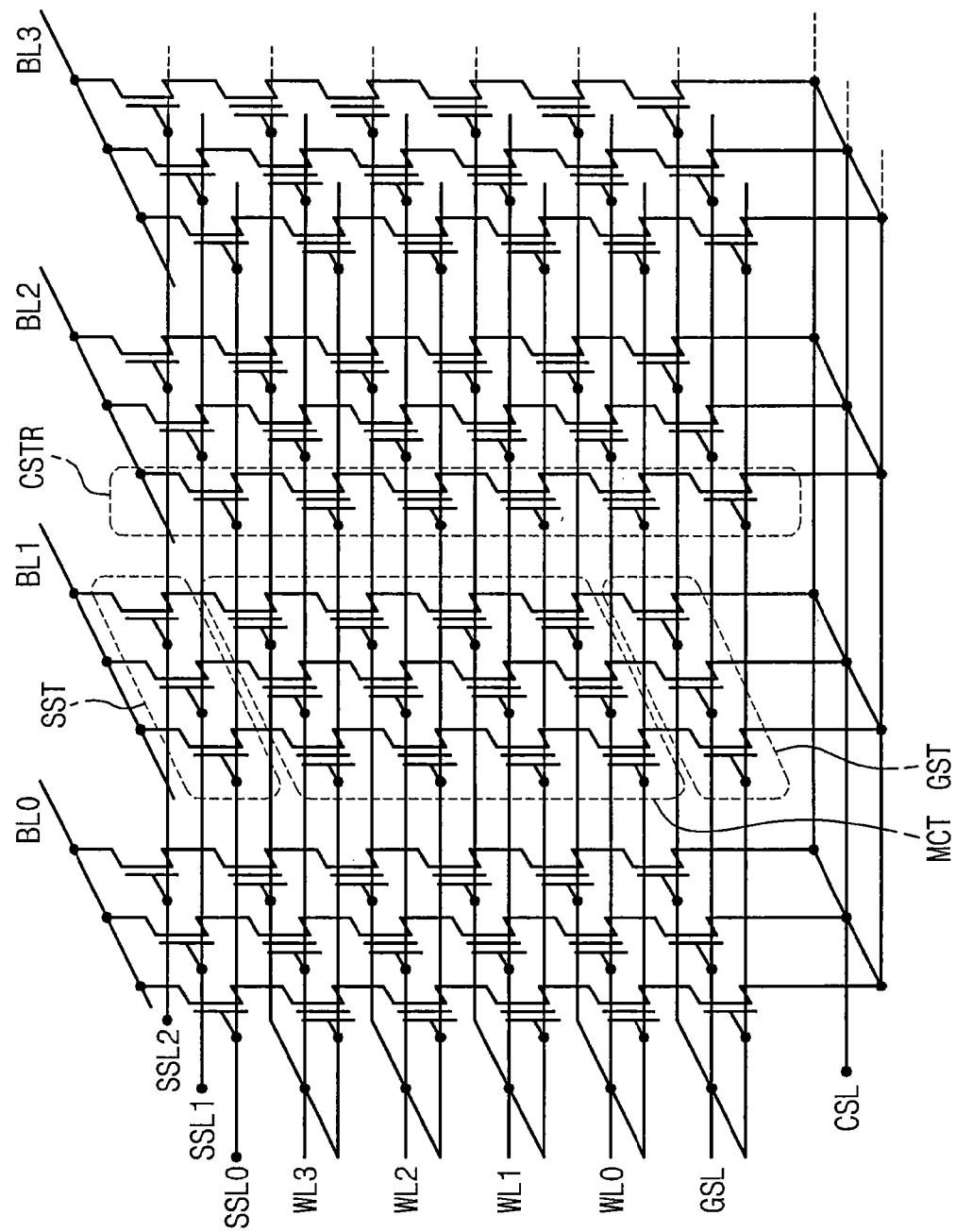
FIG. 1 is an equivalent circuit diagram relating to a portion of a semiconductor, memory device according to an exemplary embodiment.

Exemplary embodiments are described below with reference to the accompanying drawings. Many different forms and embodiments are possible without deviating from the spirit and teachings of this disclosure and so the disclosure should not be construed as limited to the exemplary embodiments set forth herein. Rather, these exemplary embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Exemplary embodiments are described herein with reference to perspective illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an equivalent circuit diagram illustrating a portion of a semiconductor memory device according to an exemplary embodiment.

Referring to FIG. 1, a semiconductor memory device according to an exemplary embodiment may include a common source line CSL, a plurality of bit lines BL0, BL1, BL2 and BL3, and a plurality of cell strings CSTR disposed between the common source line CSL and the bit lines BL0-BL3.

The common source line CSL may be a conductive layer disposed on a substrate (e.g., a semiconductor substrate) or an impurity region formed in the substrate. The bit lines BL0-BL3 may be conductive patterns (e.g., metal lines) disposed over the substrate and separated from the substrate. The bit lines BL0 to BL3 may be two dimensionally arrayed, and a plurality of cell strings CSTR may be electrically connected in parallel (to one another to each of the bit lines BL0 to BL3. Thus, the cell strings CSTR may be two dimensionally arrayed on the common source line CSL or the substrate.

Each of the cell strings CSTR may be configured to include a ground selection transistor GST connected to the common source line CSL, a string selection transistor SST connected to one of the bit lines BL0-BL3, and a plurality of memory cell transistors MCT disposed between the ground selection transistor GST and the string selection transistor SST. The ground selection transistor GST, the plurality of memory cell transistors MCT and the string selection transistor SST constituting each of the cell strings CSTR may be serially connected to each other. In addition, gate electrodes of the ground selection transistors GST may extend to form a ground selection line GSL, and gate electrodes of the string selection transistors SST may extend to form a plurality of string selection lines SSL0, SSL1 and SSL2. Further, gate electrodes of the memory cell transistors MCT may extend to form a plurality of word lines WL0, WL1, WL2 and WL3. The ground selection line GSL, the string selection lines SSL0 to SSL2 and the word lines WL0 to WL3 may be disposed between the common source line CSL and the bit lines BL0 to BL3.

The ground selection transistors GST may be located at substantially the same distance from the substrate, and the gate electrodes of the ground selection transistors GST may be commonly connected to the ground selection line GSL to have the same electrical potential. Accordingly, the ground selection line GSL may be a plate-shaped conductive pattern or a comb-shaped conductive pattern which is disposed between the common source line CSL and the lowermost memory cell transistors MCT closest to the common source line CSL. Similarly, the gate electrodes of the memory cell transistors MCT, which are located at the same level from the common source line CSL, may also be connected to one of the word lines WL0 to WL3 to have the same electrical potential. Thus, each of the word lines WL0 to WL3 may be a plate-shaped conductive pattern or a comb-shaped conductive pattern which is parallel with the substrate. Meanwhile, since the memory cell transistors MCT constituting each of the cell strings CSTR are located at different levels from one another, the plurality of word lines WL0 to WL3 disposed between the common source lines CSL and the bit lines BL0 to BL3 may also be located at different levels from one another. That is, the plurality of word lines WL0 to WL3 may be vertically stacked.

Each of the cell strings CSTR may include a semiconductor pillar that vertically extend to be connected to one of the bit lines BL0 to BL3. The semiconductor pillar of each of the cell strings CSTR may penetrate the ground selection line GSL and the word lines WL0 to WL3. In addition, the semiconductor pillar of each of the cell strings CSTR may include a body and an impurity region formed in one end of the body. Alternatively, the semiconductor pillar of each of the cell strings CSTR may include a body and at least one impurity region formed at at least one end of the body. For example, the semiconductor pillar may include a body and a drain region formed in an upper portion of the body.

A data storage layer may be disposed between the word lines WL0 to WL3 and each of the semiconductor pillars. In some embodiments, the data storage layer may include a charge storage layer. For example, the data storage layer may be a material layer including a insulating charge trap layer, a conductive floating gate or a conductive nano dots.

A dielectric layer, which acts as a gate insulation layer of the ground selection transistor GST or the string selection transistors SST, may be disposed between the ground selection line GSL and the semiconductor pillars or between the string selection lines SSL0 to SSL2 and the semiconductor pillars. The gate insulation layer of the ground selection transistor GST and/or the gate insulation layer of the string selection transistors SST may be formed of the same material as the data storage layer of the memory cell transistors MCT. Alternatively, the gate insulation layer of the ground selection transistor GST and/or the gate insulation layer of the string selection transistors SST may be formed of a gate oxide layer (e.g., a silicon oxides layer) commonly used in a metal-oxide-semiconductor field effect transistor (MOSFET).

Each of the ground and string selection transistors GST and SST and the memory cell transistors MCT may have a similar structure to the MOSFET that employs the semiconductor pillar as a channel region. That is, source/drain regions may be disposed in some portions of the semiconductor pillar, which are located between the ground selection line GSL, the word lines WL0 to WL3 and the string selection line SSL. Alternatively, the word lines WL0 to WL3 may constitute a plurality of MOS capacitors together with the semiconductor pillar without any source/drain regions therebetween. In this case, if a voltage higher than threshold voltages of the MOS capacitors is applied to the word lines WL0 to WL3, inversion regions corresponding to the source/drain regions may be formed in the semiconductor pillar between the word lines WL0 to WL3. This may be due to fringing fields. Thus, the memory cell transistors MCT of each of the cell strings CSTR may be electrically connected to one another even without formation of the source/drain regions.

Figure 2:
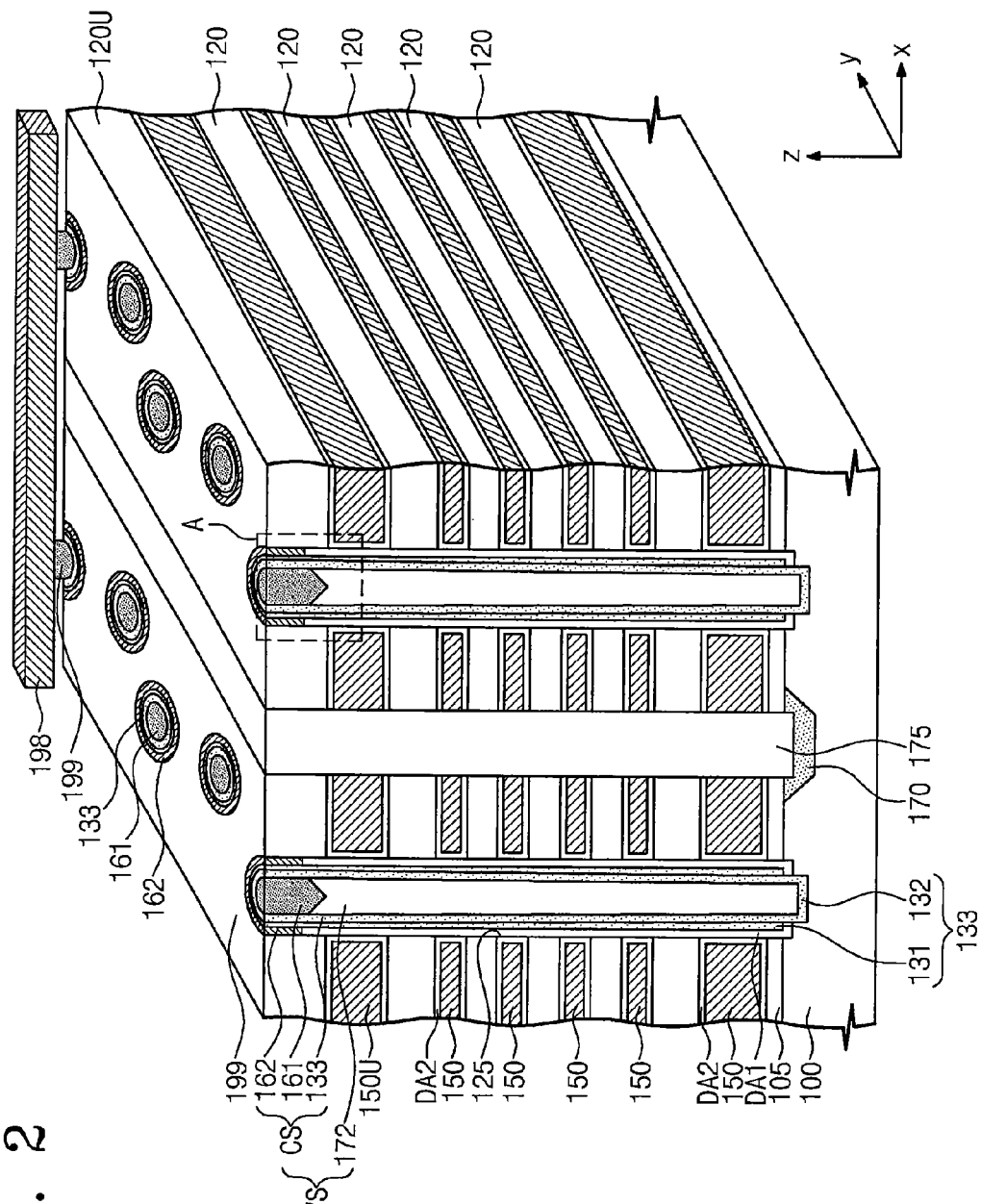
FIG. 2 is a perspective view relating to a semiconductor memory device according to an exemplary embodiment.
Figure 3:
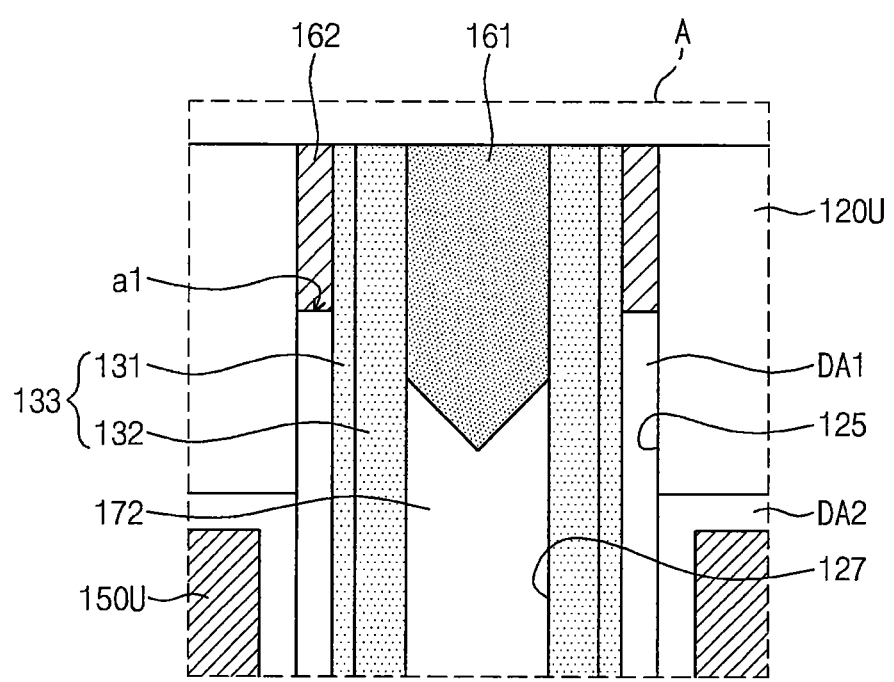
FIG. 3 is an enlarged view relating to a portion 'A' of FIG. 2.

FIG. 2 is a perspective view illustrating a semiconductor memory device according to an exemplary embodiment, and FIG. 3 is an enlarged view illustrating a portion 'A' of FIG. 2.

Referring to FIGS. 2 and 3, a substrate 100 may be provided. The substrate 100 may be a silicon substrate, a germanium substrate or a silicon-germanium substrate. The substrate 100 may have a first conductivity type. The first conductivity type may be a P-type. An electrode structure may be disposed on the substrate 100. The electrode structure may include a plurality of electrode patterns 150 and 150U, which are stacked in a z-axis direction on the substrate 100. The electrode patterns 150 and 150U may be separated from each other by insulation layers 120 and 120U. The z-axis direction may be perpendicular to a top surface of the substrate 100. The insulation layers 120 and 120U and the electrode patterns 150 and 150U may constitute a stacked structure. The lowermost electrode pattern among the electrode patterns 150 and 150U may be a lower selection gate pattern, and the uppermost electrode pattern among the electrode patterns 150 and 150U may be an upper selection gate pattern 150U. The electrode patterns between the lower selection gate pattern and the upper selection gate pattern 150U may be cell gate patterns 150. A buffer insulation layer 105 may be disposed between substrate 100 and the lower selection gate pattern. The lower selection gate pattern and the upper selection gate pattern 150U may be thicker than the cell gate patterns 150. The insulation layers 120 and 120U may include an uppermost insulation layer 120U. The uppermost insulation layer 120U may be thicker than the insulation layers 120 disposed under the uppermost insulation layer 120U.

Each of the electrode patterns 150 and 150U may include at least one of a metal layer, a metal silicide layer, a conductive metal nitride layer and a doped semiconductor layer. Each of the insulation layers 120 and 120U and the buffer insulation layer 105 may include at least one of a silicon oxide layer and a silicon oxynitride layer.

In the drawing of FIG. 2, the number of the stacked electrode patterns 150 and 150U is six and the number of the insulation layers 120 and 120U is also six. However, the number of the electrode patterns 150 and 150U and the number of the insulation layers 120 and 120U are not limited to six. Further, the number of each of the lower and upper selection gate patterns is not limited to one. For example, a plurality of lower selection gate patterns and/or a plurality of upper selection gate patterns may be provided.

Referring to FIG. 3, a data storage layer may be provided. The data storage layer may include a first dielectric layer DA1 and a second dielectric layer DA2. At least one of the first and second dielectric layer DA1 and DA2 may include a charge storage layer. The first dielectric layer DA1 may be provided on sidewalls of through holes 125 that penetrate the stacked structure to expose portions of the substrate 100. The first dielectric layer DA1 may include a plurality of insulation layers. In some embodiments, the first dielectric layer DA1 may include at least one nitride layer.

Referring again to FIGS. 2 and 3, a second dielectric layer DA2 may be disposed between the electrode patterns 15Q and 150U and the first dielectric layer DA1. The second dielectric layer DA2 may extend into an interface region between the electrode patterns 150 and 150U and the insulation layers 120 and 120U to cover top surfaces and bottom surfaces of the electrode patterns 150 and 150U.

Referring again to FIGS. 2 and 3, channel structures VS may be provided in respective ones of the through holes 125 and may be electrically connected to the substrate 100. The channel structures VS may be disposed to be substantially perpendicular to a top surface of the substrate 100 and may be disposed on the first dielectric layer DA1. Each of the channel structures VS may include a conductive pattern CS and a filling insulation pattern 172 surrounded by the conductive pattern CS. The conductive pattern CS may extend along an inner sidewall of the first dielectric layer DA1.

The conductive pattern CS may include a semiconductor pattern 133, a first conductive layer 162 on an outer sidewall of the semiconductor pattern 133, and a second conductive layer 161 on an inner sidewall of the semiconductor pattern 133. The term inner sidewall used herein may indicate a sidewall facing a central axis of the channel structure VS, which is parallel with the z-axis, and the term outer sidewall used herein may indicate a sidewall located opposite to the inner sidewall.

The semiconductor pattern 133 may include a spacer 131 and a semiconductor layer 132. The spacer 131 may be disposed on an inner sidewall of the first dielectric layer DA1, and the semiconductor layer 132 may downwardly extend to contact the substrate 100. That is, the semiconductor layer 132 may penetrate the first dielectric layer DA1 on the substrate 100. In some embodiments, the spacer 131 and the semiconductor layer 132 may include at least one of a silicon material, a germanium material and a silicon-germanium material.

The first conductive layer 162 may be disposed on the first dielectric layer DA1. In some embodiments, a bottom surface of the first conductive layer 162 may contact a top surface of the first dielectric layer DA1. The first conductive layer 162 may be disposed along an outer sidewall of the semiconductor pattern 133. Specifically, the first conductive layer 162 may be disposed to surround an upper outer sidewall of the semiconductor pattern 133. As illustrated in FIG. 2, the first conductive layer 162 may have a ring shape. However, the form of the first conductive layer 162 is not limited to the ring shape. That is, the first conductive layer 162 may be embodied in various forms according to a shape of the through holes 125. The first conductive layer 162 may be vertically aligned with the first dielectric layer DA1. For example, an inner sidewall of the first conductive layer 162 may be vertically aligned with an inner sidewall of the first dielectric layer DA1. That is, an inner sidewall of the first conductive layer 162 and an inner sidewall of the first dielectric layer DA 1 may be aligned to contact the outer sidewall of the semiconductor pattern 133. Further, an outer sidewall of the first conductive layer 162 may be vertically aligned with an outer sidewall of the first dielectric layer DA1.

An interface a1 between the first conductive layer 162 and the first dielectric layer DA1 may be located at a higher level than a top surface of the upper selection gate pattern 150U. The interface a1 is illustrated as being flat in FIG. 3. However, the interface a1 may have various profiles according to an etched material and an etching condition described in the following exemplary embodiments relating to fabrication processes. The first conductive layer 162 may include metal. For example, the first conductive layer 162 may include at least one of tungsten (W), titanium (Ti), aluminum (Al), tungsten nitride (WN), titanium nitride (TiN) and aluminum nitride (AlN).

The second conductive layer 161 may be disposed on the filling insulation pattern 172 and may be in contact with the inner sidewall of the semiconductor pattern 133. That is, the filling insulation pattern 172 may occupy a lower portion of a gap region 127 surrounded by the inner sidewall of the semiconductor pattern 133, and the second conductive layer 161 may occupy an upper portion of the gap region 127 surrounded by the inner sidewall of the semiconductor pattern 133. A bottom surface of the second conductive layer 161 may have various profiles according to the fabrication processes. The bottom surface of the second conductive layer 161 may be located at a higher level than a top surface of the upper selection gate pattern 150U. Top surfaces of the first and second conductive layers 162 and 161 may be coplanar with a top surface of the semiconductor pattern 133.

The filling insulation pattern 172 may include a silicon oxide layer and/or a silicon oxynitride layer. The second conductive layer 161 may include a silicon, germanium and/or silicon-germanium. The second conductive layer 161 may include the same material as the semiconductor pattern 133. Alternatively, the second conductive layer 161 may include metal. For example, the second conductive layer 161 may include at least one of tungsten (W), titanium (Ti), aluminum (Al), tungsten nitride (WN), titanium nitride (TiN) and aluminum nitride (AlN).

An isolation pattern 175 extending in a y-axis direction may be disposed between the channel structures VS. The isolation pattern 175 may penetrate the stacked structure to contact the top surface of the substrate 100. The isolation pattern 175 may include a high density plasma (HDP) oxide layer, a spin on glass (SOG) layer and/or a chemical vapor deposition (CVD) oxide layer. A first impurity region 170 may be disposed in the substrate 100 under the isolation pattern 175. The first impurity region 170 may have a line shape extending in the y-axis direction. The first impurity region 170 may have a different conductivity type from the substrate 100. That is, the first impurity region 170 may have a second conductivity type different from the first conductivity type. For example, the second conductivity type may be an N-type.

Conductive lines 198 may be provided on the channel structures VS and the stacked structure. The conductive lines 198 may be electrically connected to the channel structures VS. The conductive lines 198 may extend in an x-axis direction intersecting the y-axis direction which is parallel with the electrode patterns 150 and 150U. Each of the conductive lines 198 may be electrically connected to the channel structures VS arrayed in a column that is parallel with the x-axis direction. The conductive lines 198 may be electrically connected to the channel structures VS through contact plugs 199. The conductive lines 198 and the contact plugs 199 may be formed to include at least one of a metal material, a conductive metal nitride material and a doped semiconductor material.

FIGS. 4, 5, 6 and 7 are perspective views illustrating various data storage layers of semiconductor memory devices according to some exemplary embodiments. In FIGS. 4, 5, 6, and 7, the layers extending along an outer sidewall of the semiconductor pattern SP in the z-axis direction may correspond to the first dielectric layer DA1, and the layers extending along top and bottom surfaces of the electrode pattern 150 may correspond to the second dielectric layer DA2. The semiconductor pattern SP may be an element corresponding to the semiconductor pattern 133 illustrated in FIGS. 2 and 3.

In the present embodiment, the first dielectric layer may include a charge storage layer CL. The charge storage layer CL may be an insulation layer including trap sites or a material layer having nano dots. The charge storage layer CL may be formed using a chemical vapor deposition (CVD) technique or an atomic layer deposition (ALD) technique. For example, the charge storage layer CL may include one of a trap insulation layer, a floating gate, and a material layer having conductive nano dots. In some embodiments, the charge storage layer CL may include at least one of a silicon oxide layer, a silicon oxynitride layer, a silicon rich nitride layer, a nano-crystalline silicon layer and a laminated trap layer.

The first dielectric layer may further include a tunnel insulation layer TIL between the charge storage layer CL and the semiconductor pattern SP. The tunnel insulation layer TIL may be one of material layers having a band gap energy which is greater than that of the charge storage layer CL. The tunnel insulation layer TIL may be formed using a chemical vapor deposition (CVD) technique or an atomic layer deposition (ALD) technique. For example, the tunnel insulation layer TIL may be a silicon oxide layer formed using the CVD technique or the ALD technique. In some embodiments, the tunnel insulation layer TIL may be subject to a particular annealing process. The annealing process may correspond to a normal annealing process employing at least one of a nitrogen gas and an oxygen gas as an ambient gas or a rapid thermal nitridation (RTN) process.

Figure 4:
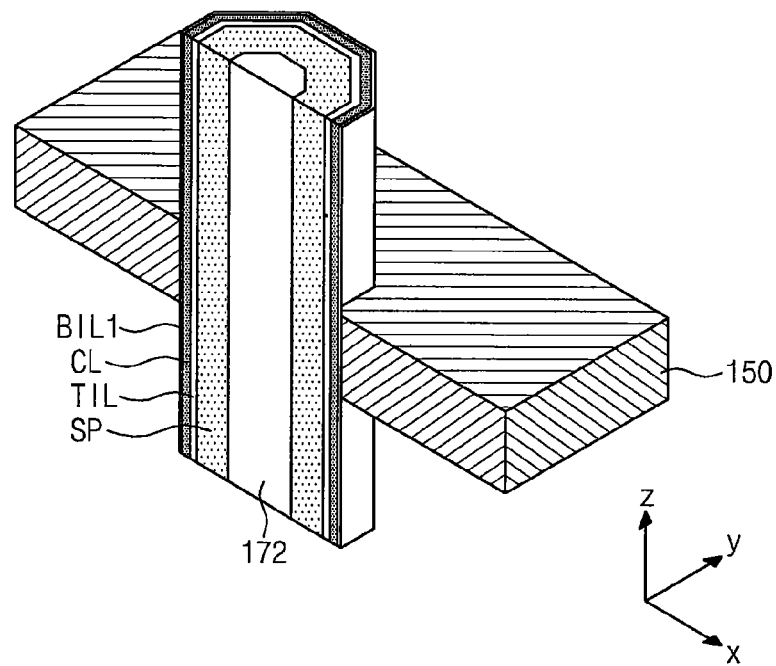
FIGS. 4 to 7 are perspective views relating to data storage layers of semiconductor memory devices according to some exemplary embodiments.
Figure 5:
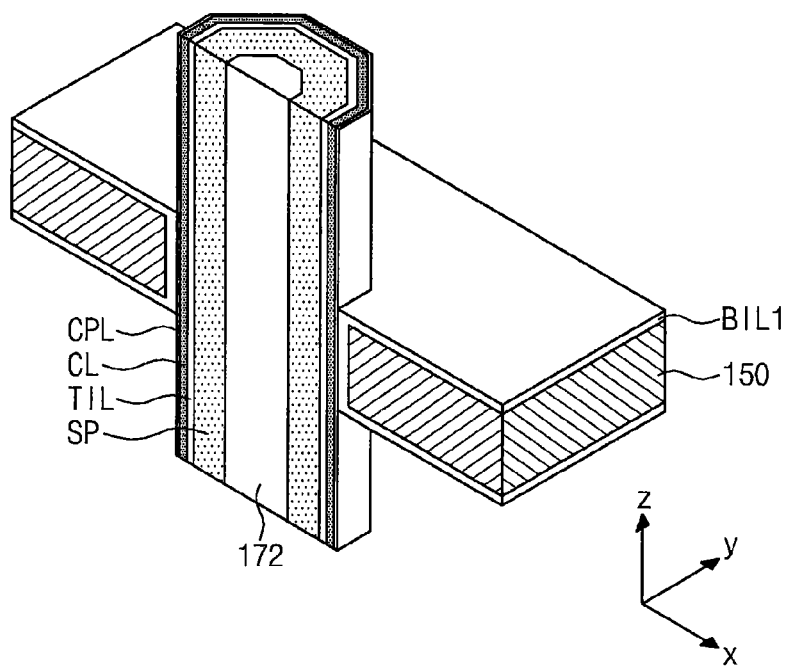

The first dielectric layer may further include a first blocking insulation layer BIL1, as illustrated in FIG. 4. Alternatively, the first dielectric layer may further include a capping layer CPL, as illustrated in FIG. 5. The second dielectric layer may include a first blocking insulation layer BIL1 on the electrode pattern 150, as illustrate in FIGS. 5, 6 and 7. The second dielectric layer may further include a second blocking insulation layer BIL2 disposed between the electrode pattern 150 and the first blocking insulation layer BIL1, as illustrate in FIG. 7. In another embodiment, the second dielectric layer may not be provided, as illustrated in FIG. 4.

The second blocking insulation layer BIL2 may be formed of a different material from the first blocking insulation layer BIL1 and one of the first and second blocking insulation layers BIL1 and BIL2 may be one of material layers having a band gap energy which is less than that of the tunnel insulation layer TIL and is greater than that of the charge storage layer CL. Further, the first and second blocking insulation layers BIL1 and BIL2 may be formed using a CVD technique or an ALD technique, and at least one the first and second blocking insulation layers BIL1 and BIL2 may be formed using a wet oxidation process. In some embodiments, the first blocking insulation layer BIL1 may be one of high-k dielectric layers such as an aluminum oxide layer and a hafnium oxide layer, and the second blocking insulation layer BIL2 may be a material layer having a dielectric constant which is less than that of the first blocking insulation layer BIL1. Alternatively, the second blocking insulation layer BIL2 may be one of high-k dielectric layers, and the first blocking insulation layer BIL1 may be a material layer having a dielectric constant which is less than that of the second blocking insulation layer BIL2.

The capping layer CPL may be a material layer having an etch selectivity with respect to the charge storage layer CL and/or sacrificial layers described hereinafter. For example, when the sacrificial layers are formed of a silicon nitride layer, the capping layer CPL may be a silicon oxide layer. In this case, while the sacrificial layers are removed, the capping layer CPL may act as an etch stop layer that prevents the charge storage layer CL from being damaged. Meanwhile, when the capping layer CPL is disposed between the electrode pattern 150 and the charge storage layer CL as illustrated in FIG. 5, the capping layer CPL may be formed of a material layer which is capable of preventing charges stored in the charge storage layer CL from being discharged. That is, the capping layer CPL may be formed of a material layer which is capable of preventing a back tunneling phenomenon of the charges stored in the charge storage layer CL. For example, the capping layer CPL may be one of silicon oxide layer and a high-k dielectric layer.

A method of forming semiconductor devices according to an embodiment will be described with reference to FIGS. 8 to 17.

Figure 8:
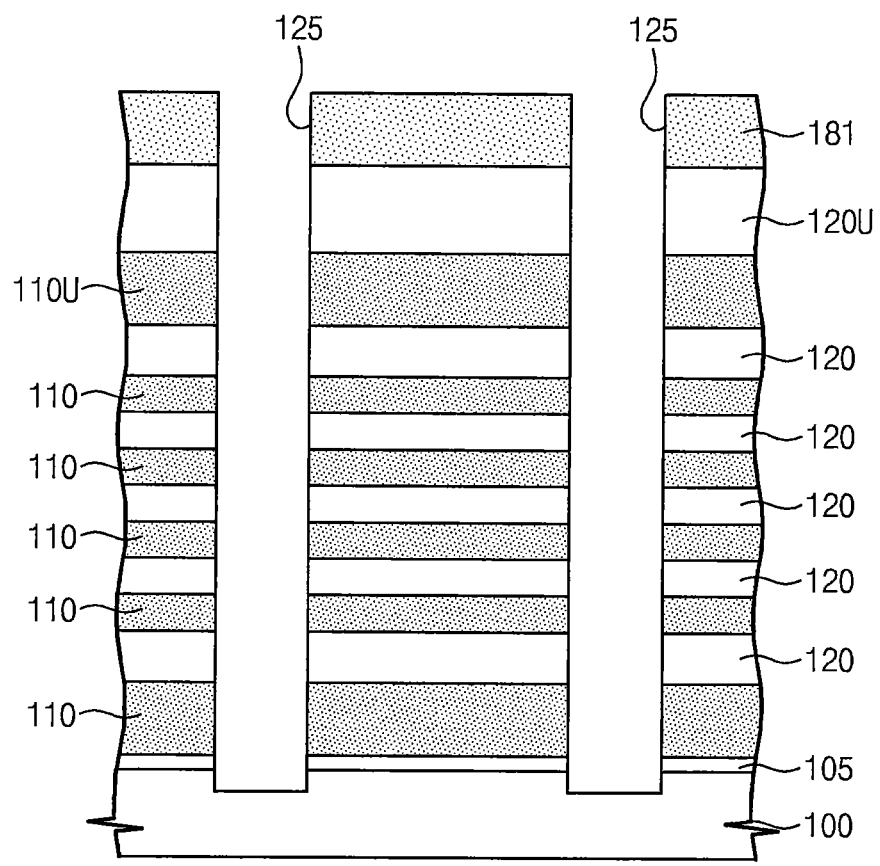
FIGS. 8 to 12 and 14 to 17 are cross sectional views relating to methods of forming semiconductor memory devices according to an exemplary embodiment.

Referring to FIG. 8, a substrate 100 may be provided. The substrate 100 may be a semiconductor substrate. For example, the substrate 100 may be a silicon substrate, a germanium substrate, a silicon-germanium substrate or a compound semiconductor substrate. The substrate 100 may have a first conductivity type.

First material layers and second material layers (different from the first materials) may be alternately and repeatedly stacked on the substrate 100 to form a stacked structure. The first material layers may be sacrificial layers 110 and 110U, and the second material layers may be insulation layers 120 and 120U. The insulation layers 120 and 120U may be formed of a material layer having an etch selectivity with respect to the sacrificial layers 110 and 110U and vice versa. That is, when the sacrificial layers 110 and 110U are etched using a predetermined etch recipe, an etch rate of the insulation layers 120 and 120U may be relatively low compared to that of the sacrificial layers 110 and 110U. The etch selectivity may be expressed as a ratio of etch rates of two different materials exposed to a specific etch recipe. In some embodiments, the insulation layers 120 and 120U may be formed of a material having an etch selectivity within the range of about 1:30 to about 1:100 with respect to the sacrificial layers 110 and 110U. For example, the insulation layers 120 and 120U may be formed of at least one of a silicon oxide layer and a silicon nitride layer, and the sacrificial layers 110 and 110U may be formed of a material selected from the group consisting of a silicon layer, a silicon oxide layer, a silicon carbide layer and a silicon nitride layer. For the purpose of ease and convenience in explanation, the exemplary embodiments will be described hereinafter under the assumption that the insulation layers 120 and 120U include a silicon oxide layer and the sacrificial layers 110 and 110U include a silicon nitride layer. A buffer insulation layer 105 may be provided between the lowermost layer among the sacrificial layers 110 and 110U and the substrate 100. The buffer insulation layer 105 may be formed of a silicon oxide layer.

Some layers of the sacrificial layers 110 and 110U may be formed to a different thickness from the other layers of the sacrificial layers 110 and 110U. For example, the uppermost layer 110U and the lowermost layer of the sacrificial layers 110 and 110U may be formed to be thicker than the sacrificial layers 110 between the uppermost layer 110U and the lowermost layer 110. Similarly, at least one layer of the insulation layers 120 and 120U may be formed to a different thickness from the other layers of the insulation layers 120 and 120U. For example, the uppermost layer 120U of the insulation layers 120 and 120U may be formed to be thicker than the insulation layers 120 under the uppermost layer 120U.

A mask pattern 181 may be formed on the uppermost insulation layer 120U. The mask pattern 181 may be formed of a material having an etch selectivity with respect to the sacrificial layers 110 and 110U and the insulation layers 120 and 120U. For example, when the sacrificial layers 110 and 110U are formed of a silicon nitride layer and the insulation layers 120 and 120U are formed of a silicon oxide layer, the mask pattern 181 may be formed of a material layer including polysilicon. The insulation layers 120 and 120U, the sacrificial layers 110 and 110U and the buffer insulation layer 105 may be etched using the mask pattern 181 as an etch mask, thereby forming through holes 125 that expose the substrate 100. The through holes 125 may be two dimensionally arrayed on the substrate 100. The through holes 125 may be formed using an anisotropic etching process. Each of the through holes 125 may be formed to have a circular shape. However, the shape of the through holes 125 is not limited to the hole shape. While the through holes 125 are formed, the substrate 100 may be recessed due to an over-etch step.

Figure 9:
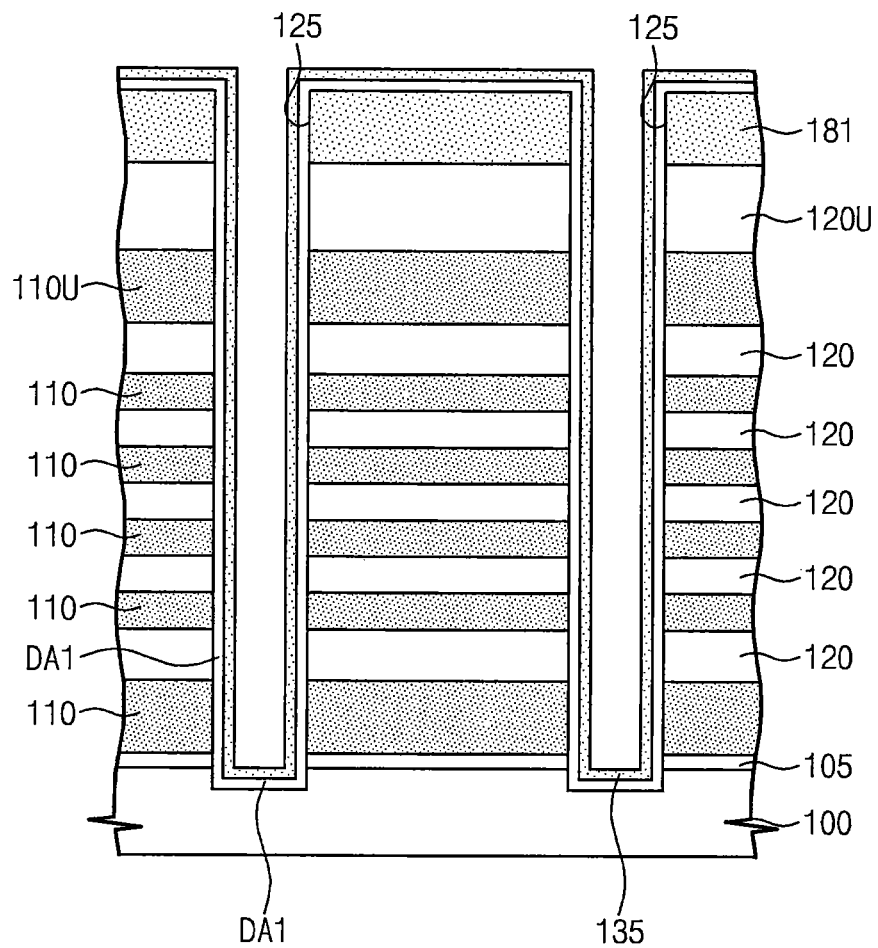

Referring to FIG. 9, a first dielectric layer DA1 and a spacer layer 135 may be sequentially formed on the substrate including the through holes 125. In some embodiments, the first dielectric layer DA1 and the spacer layer 135 may be conformally formed along inner surfaces of the through holes 125. The first, dielectric layer DA1 may be one of the first dielectric layers described with reference to FIGS. 4, 5, 6 and 7. The spacer layer 135 may be formed to include at least one of a silicon material, a germanium material and a silicon-germanium material. When the first dielectric layer DA1 and the spacer layer 135 are conformally formed along the inner surfaces of the through holes 125, the through holes 125 may not be completely filled with the first dielectric layer DA1 and the spacer layer 135. The first dielectric layer DA1 and the spacer layer 135 may be formed using an atomic layer deposition (ALD) process or a chemical vapor deposition (CVD) process.

Figure 10:
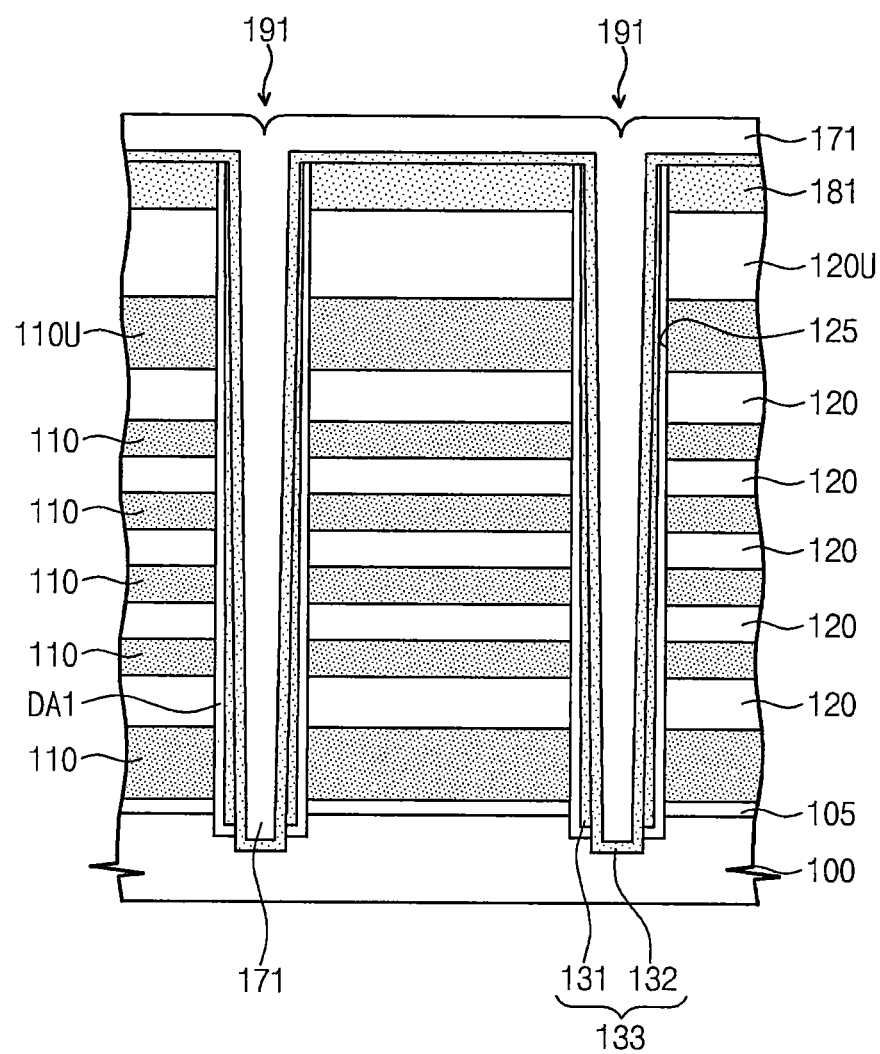

Referring to FIG. 10, the spacer layer 135 may be anisotropically etched to form spacers 131 in the through holes 125. The anisotropic etching process may be performed using plasma ions that vertically travel straight. While the spacers 131 are formed, the first dielectric layer DA1 may also be anisotropically etched to expose the substrate 100 in the through holes 125 and a top surface of the mask pattern 181. A semiconductor layer 132 and a filling insulation layer 171 may be sequentially formed on the substrate including the spacers 131. The semiconductor layer 132 may extend along inner sidewalls of the spacers 131 to contact the substrate 100. In some embodiments, the semiconductor layer 132 may include at least one of a silicon material, a germanium material and a silicon-germanium material. The filling insulation layer 171 may be formed to completely fill the through holes 125.

The filling insulation layer 171 may be formed using a plurality of deposition processes. For example, the filling insulation layer 171 may be formed by depositing a first insulation layer on the semiconductor layer 132, etching back the first insulation layer, and depositing a second insulation layer on the resultant structure where the etch back process is performed. The plurality of deposition processes and the etch back process may prevent voids from being formed in the filling insulation layer 171. The filling insulation layer 171 may be formed to include at least one of a silicon oxide layer and a silicon oxynitride layer. In some embodiments, the filling insulation layer 171 may be formed to have an uneven surface profile due to the through holes 125. As a result, notches 191 may be formed over the through holes 125.

The semiconductor layer 132 and the filling insulation layer 171 may extend onto the mask pattern 181. The spacer 131 and the semiconductor layer 132 may constitute a semiconductor pattern 133.

Figure 11:
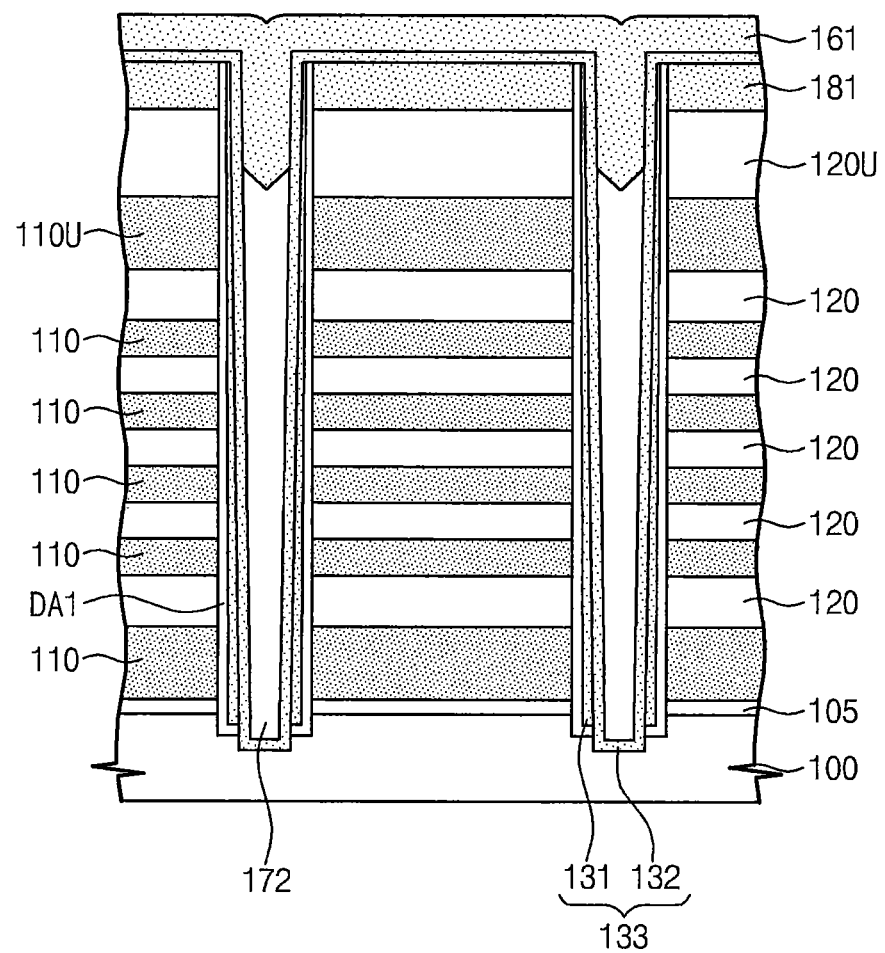

Referring to FIG. 11, the filling insulation layer 171 may be partially removed to form filling insulation patterns 172 in respective ones of the through holes 125. In some embodiments, the filling insulation patterns 172 may be formed by planarizing the filling insulation layer 171 and etching the planarized filling insulation layer 171. Each of the filling insulation patterns 172 may be formed to have a concave top surface profile which is similar to the notch profile 191. Alternatively, each of the filling insulation patterns 172 may be formed to have substantially a flat top surface. In some embodiments, the top surfaces of the filling insulation patterns 172 may be located at a lower level than a bottom surface of the mask pattern 181 and at a higher level than a top surface of the uppermost sacrificial layer 110U. After the filling insulation patterns 172 are formed, an upper portion of an inner sidewall of the semiconductor pattern 133 in each through hole 125 may be exposed.

A second conductive layer 161 may be formed on the substrate including the filling insulation patterns 172. The second conductive layer 161 may be formed to fill recessed regions on the filling insulation patterns 172. The second conductive layer 161 may be in contact with the exposed inner sidewall of the semiconductor pattern 133 in each through hole 125. The second conductive layer 161 may be formed to include at least ones of a silicon material, a germanium material and a silicon-germanium material. In some embodiments, the second conductive layer 161 may be formed of the same material as the semiconductor pattern 133. Alternatively, the second conductive layer 161 may be formed of a metal layer. For example, the second conductive layer 161 may be formed to include at least one of tungsten (W), titanium (Ti), aluminum (Al), tungsten nitride (WN), titanium nitride (TiN) and aluminum nitride (AlN).

Figure 12:
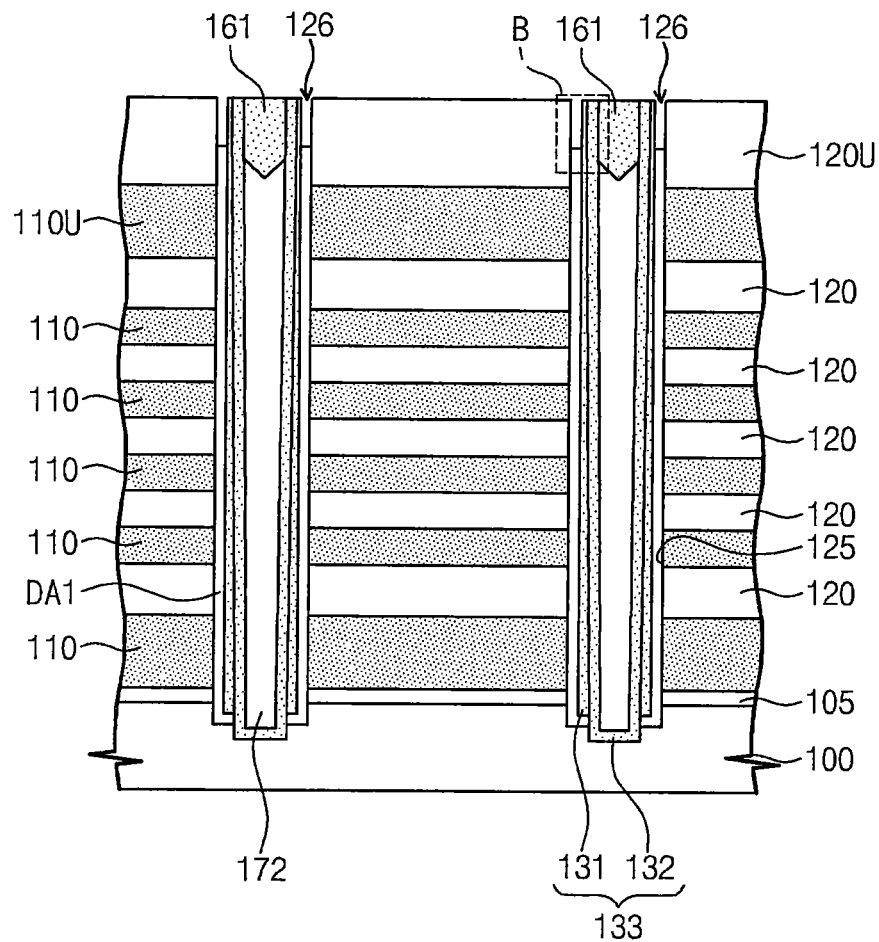

Referring to FIG. 12, the second conductive layer 161 and the semiconductor layer 132 may be planarized to expose the uppermost insulation layer 120U. The planarization process may separate the second conductive layer 161 into a plurality of second conductive layers 161 defined in respective ones of the through holes 125. Further, the planarization process may separate the semiconductor pattern 133 into a plurality of semiconductor patterns 133 defined in respective ones of the through holes 125. The planarization process may expose top surfaces of the first dielectric layers DA1 in respective ones of the through holes 125.

Upper portions of the first dielectric layers DA1 may be removed to form first recessed regions 126 in respective ones of the through holes 125. The removal process of the upper portions of the first dielectric layers DA1 may be embodied in many different forms according to the configurations and/or structures of the first dielectric layer DA1 described with reference to FIGS. 4 to 7. In some embodiments, when the first dielectric layer DA1 includes a first layer and a second layer having an etch selectivity with respect to each other, the first layer having an etch selectivity with respect to the uppermost insulation layer 120U may be etched and the second layer may be then etched. Hereinafter, the removal process of the upper portions of the first dielectric layers DA1 will be described in detail with reference to FIG. 13.

Figure 13:
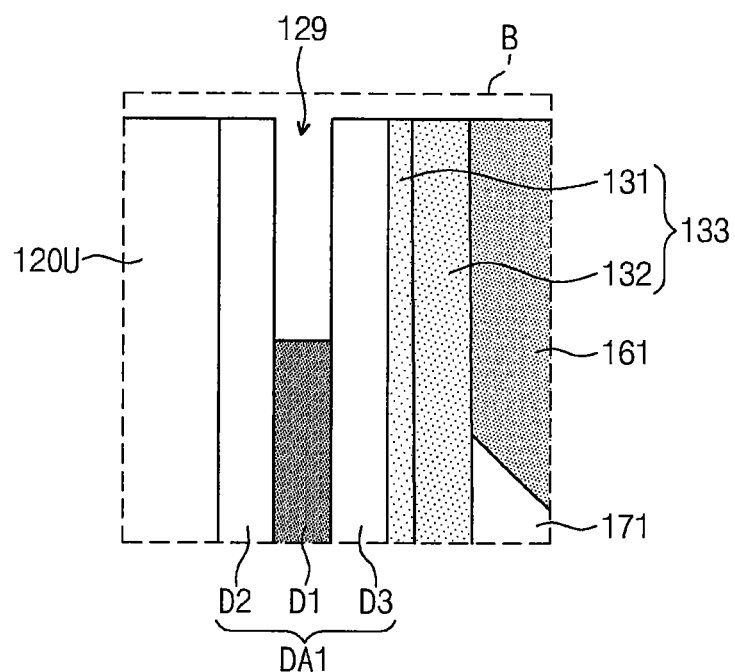
FIG. 13 is an enlarged view relating to a portion 'B' of FIG. 12.

FIG. 13 is an enlarged view illustrating a portion 'B' of FIG. 12. Referring to FIG. 13, the upper portions of the first dielectric layers DA1 are removed by an etch process when the first dielectric layer DA1 includes a first layer D1 and second layers D2 and D3. The first layer D1 may correspond to the charge storage layer CL illustrated in FIGS. 4 to 7, and the second layer D3 may correspond to the tunnel insulation layer TIL illustrated in FIGS. 4 to 7. Further, the second layer D2 may correspond to the first blocking insulation layer BIL1 illustrated in FIG. 4 or the capping layer CPL illustrated in FIG. 5. The first dielectric layer DA1 illustrated in FIGS. 6 and 7 may not include the second layer D2.

One of the first layer D1 and the second layers D2 and D3, which has an etch selectivity with respect to the uppermost insulation layer 120U, may be first etched. In some embodiments, an upper portion of the first layer D1 may be selectively etched, as illustrated in FIG. 13. In the event that the first layer D1 includes at least one of a silicon nitride layer and a silicon oxynitride layer, the first layer D1 may be etched using an etchant including phosphoric acid. After the first layer D1 is etched, a second recessed region 129 may be formed between the second layers D2 and D3. In some embodiments, a bottom surface of the second recessed region 129 may be located at a higher level than a top surface of the uppermost sacrificial layer 110U. After the first layer D1 is etched, the second layers D2 and D3 may be simultaneously etched. In some embodiments, the second layers D2 and D3 may be etched using an isotropic etching process. Since the second recessed region 129 exposes upper sidewalls of the second layers D2 and D3, the second layers D2 and D3 may be laterally etched by an etchant or an etching gas supplied into the second recessed region 129 during the isotropic etching process for etching the upper portions of the second layers D2 and D3. If the second layers D2 and D3 do not have an etch selectivity with respect to the uppermost insulation layer 120U, an upper portion of the uppermost insulation layer 120U may also be etched to reduce a thickness of the uppermost insulation layer 120U while the second layers D2 and D3 are etched.

Unlike the present exemplary embodiment, the upper portion of the first dielectric layer DA1 may be removed using a photolithography process and an etching process. In this case, a mask pattern, for example, a photoresist pattern should be formed to have an opening over the through hole 125, and a diameter of the opening should be greater than a diameter of the through hole 125 in consideration of an alignment margin between the opening and the through hole. Therefore, top surface areas of channel structures, which are formed in the through holes 125 in a subsequent process, may increase to reduce a distance between the channel structures. Thus, the probability of electrical shortage between the channel structures may increase. However, according to the present exemplary embodiment, the upper portions of the first dielectric layers DA1 can be selectively removed without substantial increase of the upper diameters of the through holes 125. As a result, an alignment margin between the channel structures and contact plugs formed on the channel structures can be optimized even without substantial reduction of the distance between the channel structures.

Figure 14:
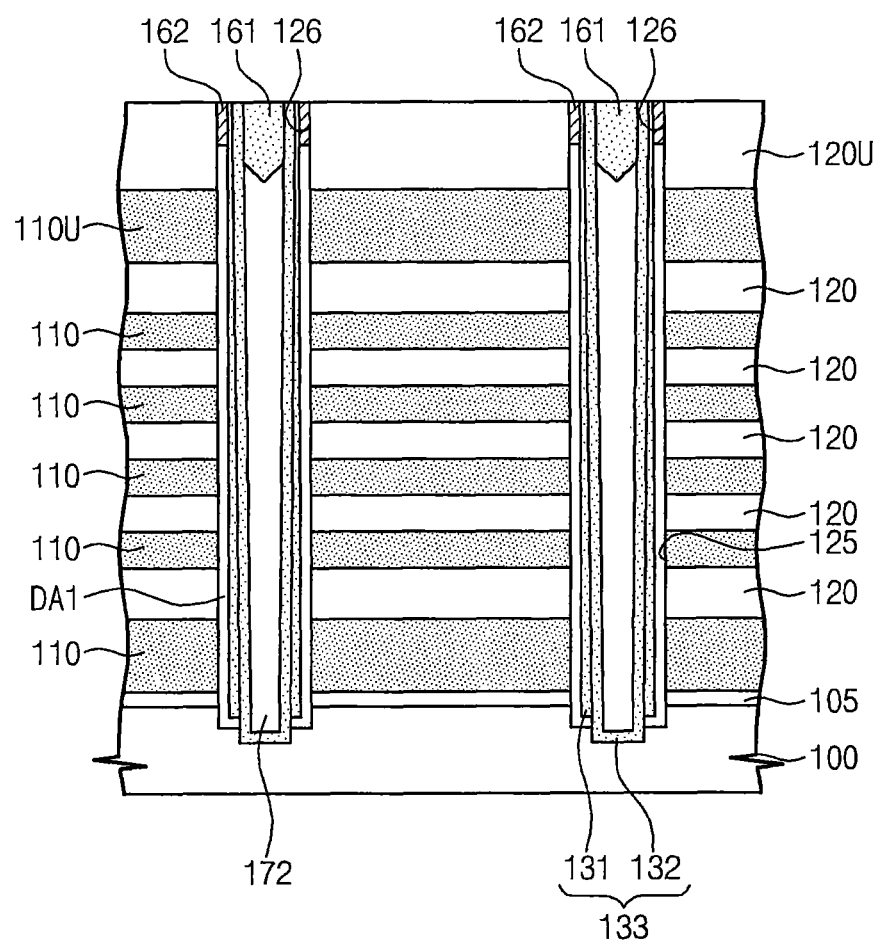

Referring to FIG. 14, first conductive layers 162 may be formed in respective ones of the first recessed regions 126. The first conductive layers 162 may be formed by forming a conductive layer on the substrate including the first recessed regions 126 and planarizing the conductive layer. The first and second conductive layers 162 and 161, the semiconductor pattern 133 and the filling insulation pattern 172 in each of the through holes 125 may constitute a channel structure (refer to VS in FIG. 2). In each of the through holes 125, the first conductive layer 162 may be formed to contact the top surface of the first dielectric layer DA1 and the sidewall of the semiconductor pattern 133. The first conductive layers 162 may be formed of a metal material. For example, the first conductive layers 162 may be formed to include at least one of tungsten (W), titanium (Ti), aluminum (Al), tungsten nitride (WN), titanium nitride (TiN) and aluminum nitride (AlN). The first conductive layers 162 may be formed after the second conductive layers 161 are formed.

Figure 15:
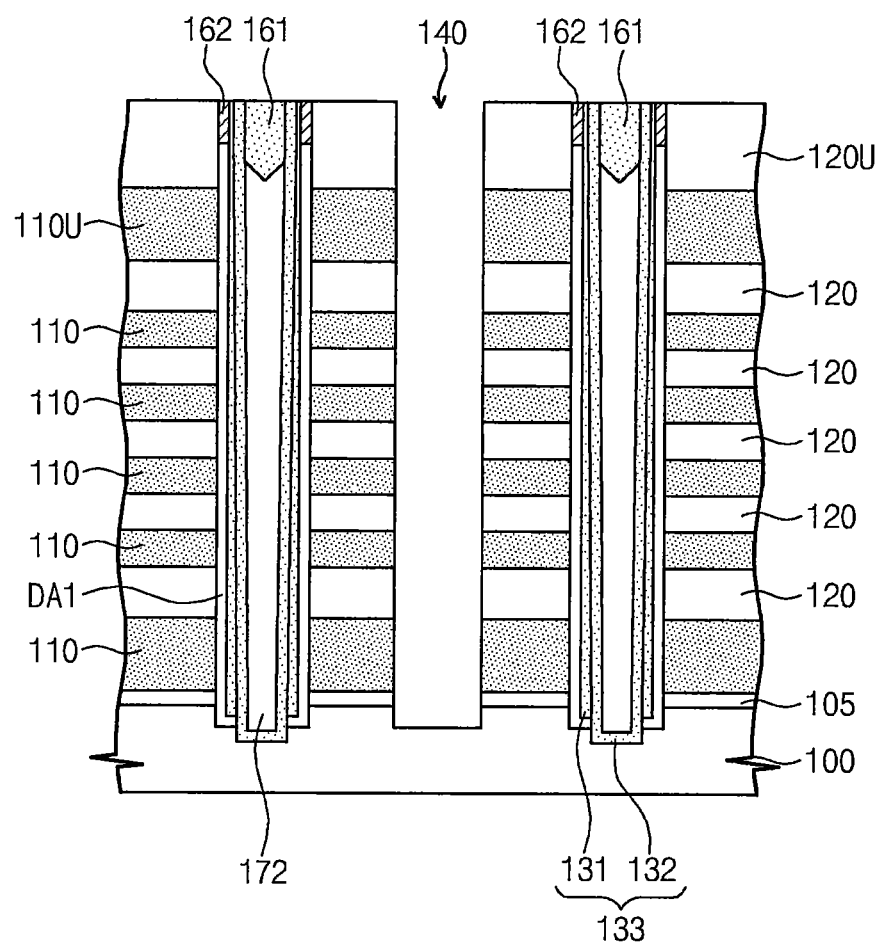
Figure 16:
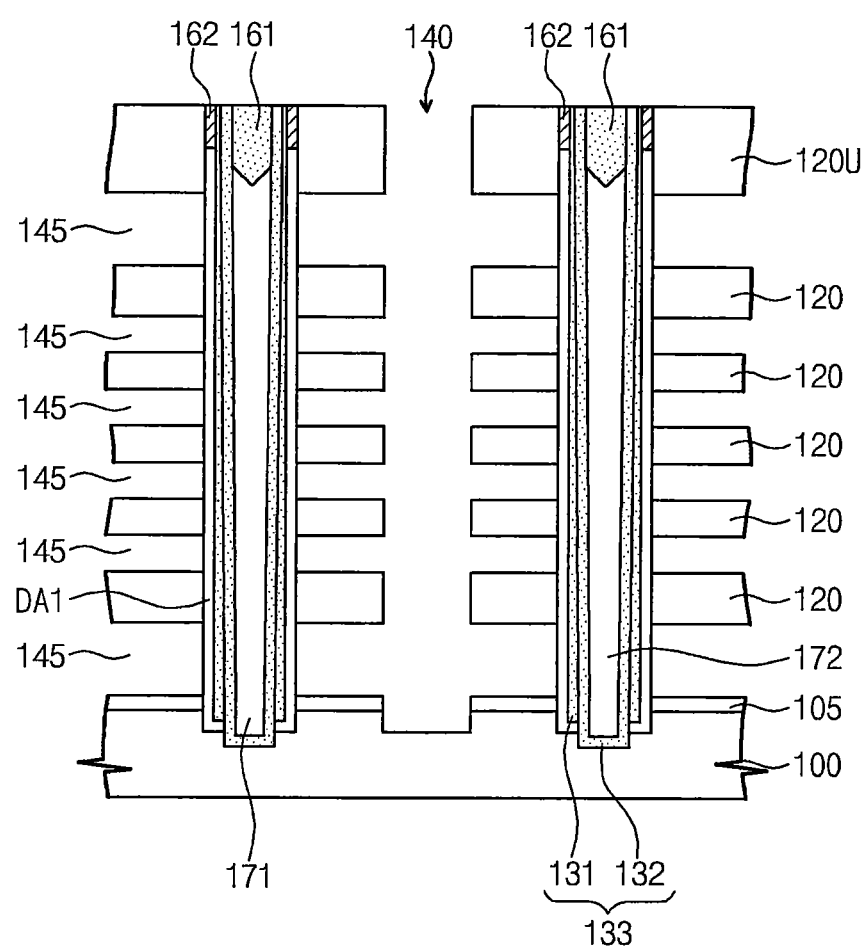

Referring to FIGS. 15 and 16, the insulation layers 120 and 120U and the sacrificial layers 110 and 110U may be patterned to form a first trench 140. The first trench 140 may be formed using an anisotropic etching process. The first trench 140 may expose sidewalls of the patterned insulation layers 120 and 120U and the patterned sacrificial layers 110 and 110U. Further, the first trench 140 may expose a portion of the substrate 100. Alternatively, the first trench 140 may expose a portion of the buffer insulation layer 105. For the purpose of ease and convenience in explanation, the exemplary embodiments will be described hereinafter in conjunction with an example that the first trench 140 exposes the substrate 100.

Using a selective etching process, the exposed sacrificial layers 110 and 110U may be removed to form horizontal recessed regions 145. The recessed regions 145 may be formed by laterally etching the sacrificial layers 110 and 110U using an etch recipe that suppresses etch of the insulation layers 120 and 120U and the first dielectric layer DA1. For example, when the sacrificial layers 110 and 110U are formed of a silicon nitride layer and the insulation layers 120 and 120U are formed of a silicon oxide layer, the selective etching process may be performed using an etchant including a phosphoric acid solution.

Figure 17:
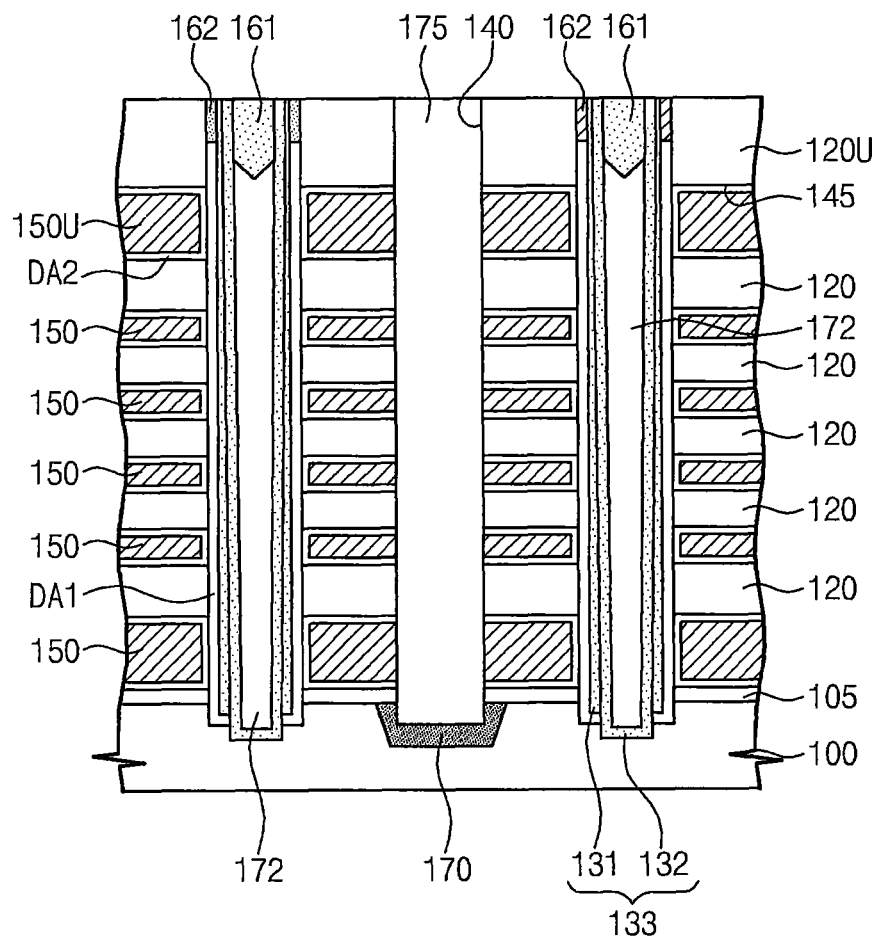

Referring to FIG. 17, a second dielectric layer DA2 and an electrode pattern 150 or 150U may be formed in each of the recessed regions 145. The second dielectric layer DA2 may be formed to cover an inner surface of the recessed region 145, and the electrode pattern 150 or 150U may be formed to fill the recessed region 145 surrounded by the second dielectric layer DA2.

Forming the second dielectric layers DA2 and the electrode patterns 150 and 150U may include sequentially forming a data storage layer and a conductive layer on the substrate including the recessed regions 145 and removing the conductive layer in the first trench 140. In some embodiments, the conductive layer may be formed to completely fill the recessed regions 145 and to partially fill the first trench 140. In this embodiment, the electrode patterns 150 and 150U may be formed by etching the conductive layer using an isotropic etching process. Alternatively, the conductive layer may be formed to completely fill the first trench 140. In this case, the electrode patterns 150 and 150U may be formed by etching the conductive layer using an anisotropic etching process.

Figure 6:
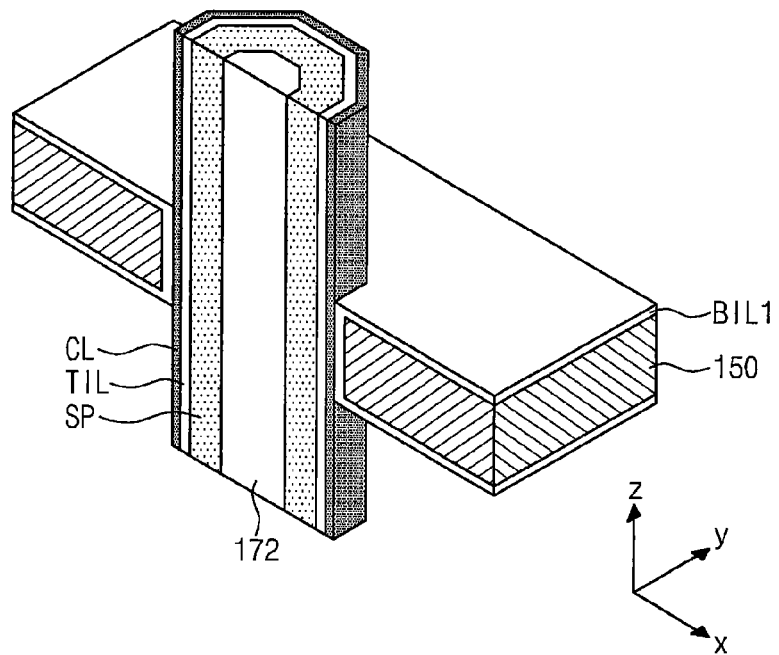
Figure 7:
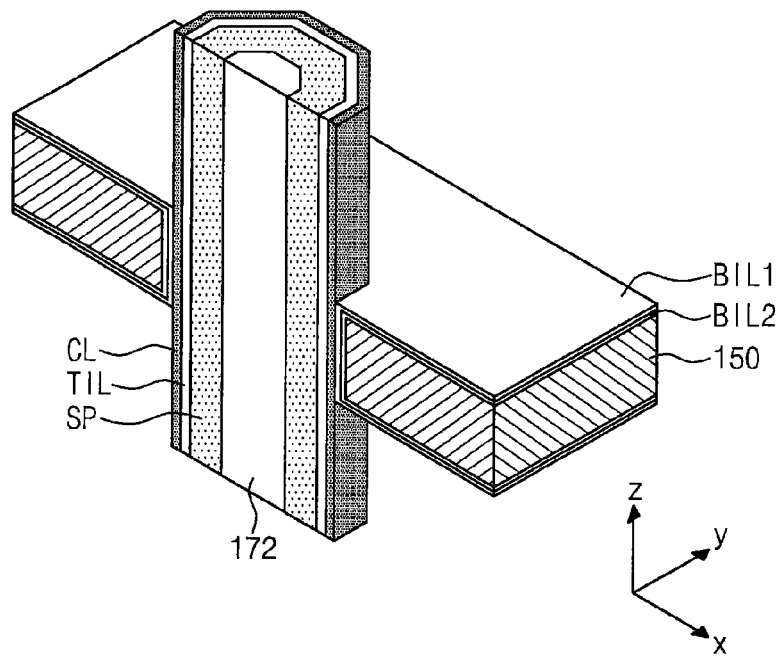

Each of the second dielectric layers DA2 may be formed to have the same structure as any one of the second dielectrics layers described with reference to FIGS. 5 to 7. In another embodiment, formation of the second dielectric layers DA2 may be omitted, as illustrated in FIG. 4. Each of the electrode patterns 150 and 150U may include at least one of a doped silicon layer, a metal layer, a metal nitride layer and a metal silicide layer. For example, the electrode patterns 150 and 150U may include a tantalum nitride layer or a tungsten layer.

A first impurity region 170 may be formed in the substrate 100 under the first trench 140. The first impurity region 170 may be formed to have a different conductivity type from the substrate 100. That is, the first impurity region 170 may be formed to have a second conductivity type, for example, an N-type. The first impurity region 170 may be formed using an ion implantation process. Second impurity regions (not shown) may be formed in upper portions of the semiconductor patterns 133 and the second conductive layers 161. The second impurity regions may be formed to have the same conductivity type as the first impurity region 170. The second impurity regions may be formed simultaneously with the first impurity region 170.

An isolation pattern 175 may be formed to fill the first trench 140. The isolation pattern 175 may be formed by depositing an insulation material on the substrate including the first impurity region 170 and the second impurity regions and by planarizing the insulation material to expose the top surface of the uppermost insulation layer 120U. The isolation pattern 175 may be formed of at least one of a silicon oxide layer, a silicon oxynitride layer and a silicon nitride layer. The planarization of the insulation layer may be performed using a chemical mechanical polishing (CMP) technique or an etchback technique. Subsequently, conductive lines 198 may be formed on the channel structures (VS of FIG. 2), as illustrated in FIG. 2. The conductive lines 198 may be electrically connected to the channel structures (VS of FIG. 2) through contact plugs 199.

According to the exemplary embodiment described above, each of the channel structures VS may be formed to include the first and second conductive layers 162 and 161. Thus, a contact area between the channel structure VS and the contact plug 199 can be increased to reduce the probability of misalignment between the channel structure VS and the contact plug 199. Further, the fabrication method according to the above exemplary embodiment can prevent a top surface area of each of the channel structures VS from being excessively increased. Thus, the probability of electrical shortage between the channel structures can be reduced.

Figure 18:
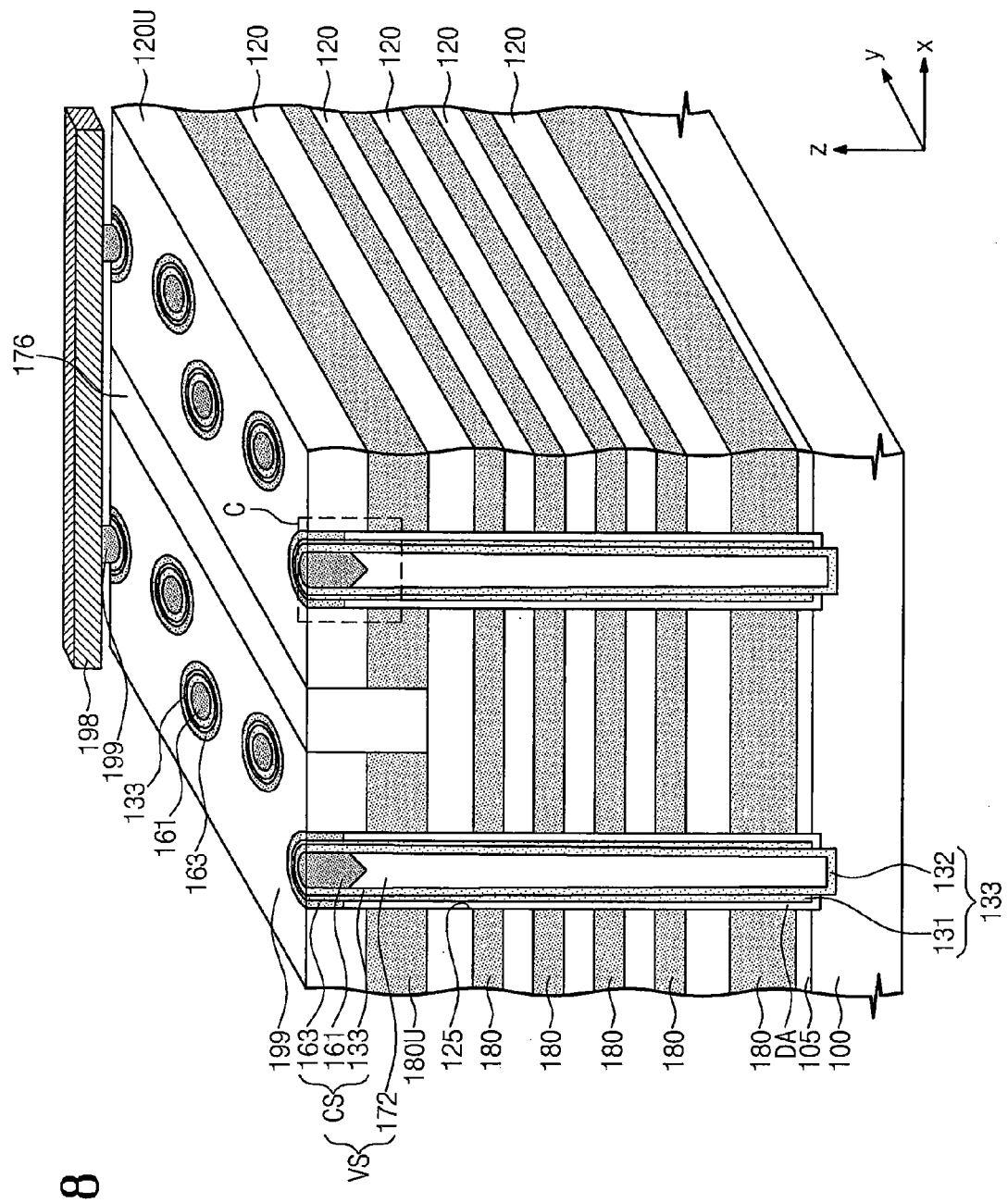
FIG. 18 is a perspective view relating to semiconductor memory devices according to another exemplary embodiment.
Figure 19:
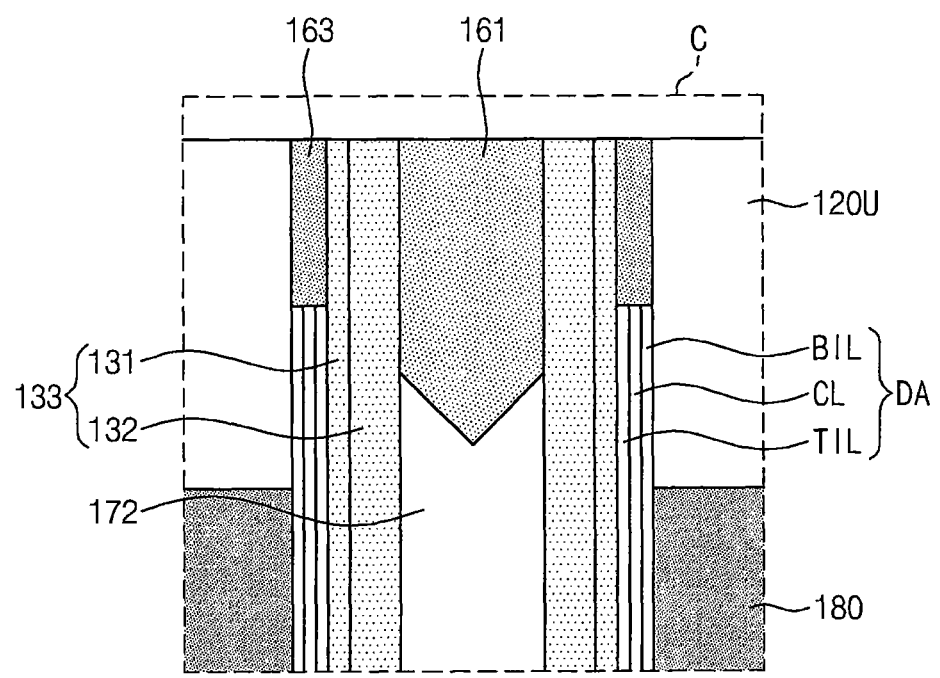
FIG. 19 is an enlarged view relating to a portion 'C' of FIG. 18.

FIG. 18 is a perspective view illustrating a semiconductor memory device according to another exemplary embodiment, and FIG. 19 is an enlarged view illustrating a portion 'C' of FIG. 18. For the purpose of ease and convenience in explanation, the descriptions to the same components as illustrated in the previous embodiment will be omitted or mentioned briefly.

Referring to FIGS. 18 and 19, an electrode structure may be provided on a substrate 100. The electrode structure may include a plurality of electrode patterns 180 and 180U that are vertically stacked in a z-axis direction and spaced apart from each other by insulation layers 120 and 120U. The z-axis direction may be perpendicular to a top surface of the substrate 100. The insulation layers 120 and 120U and the electrode patterns 180 and 180U may constitute a stacked structure. The lowermost pattern among the electrode patterns 180 and 180U may be a lower selection gate pattern, and the uppermost pattern among the electrode patterns 180 and 180U may be an upper selection gate pattern 180U. The electrode patterns between the lower selection gate pattern and the upper selection gate pattern 180U may correspond to cell gate patterns. A buffer insulation layer 105 may be disposed between the substrate 100 and the lower selection gate pattern 180. The insulation layers may include the uppermost insulation layer 120U and the insulation layers 120 under the uppermost insulation layer 120U. Each of the upper selection gate patterns 180U may extend along the y-axis direction. An isolation pattern 176 may be disposed between the adjacent selection gate patterns 180U.

Each of the electrode patterns 180 and 180U may include at least one of a doped semiconductor layer, a metal layer, a conductive metal nitride layer and a metal silicide layer. Each of the insulation layers 120 and 120U and the buffer insulation layer 105 may include at least one of a silicon oxide layer and a silicon oxynitride layer.

A data storage layer DA may be provided on a sidewall of each of the through holes 125 that penetrate the stacked structure to expose the substrate 100. The data storage layer DA may include a plurality of insulation layers. For example, the data storage layer DA may include a tunnel insulation layer TIL, a charge storage layer CL and a blocking insulation layer BIL.

Channel structures VS may be disposed on respective ones of inner sidewalls of the data storage layers DA. The channel structures VS may be electrically connected to the substrate 100. Each of the channel structures VS may include a conductive pattern CS and a filling insulation pattern 172 surrounded by the conductive pattern CS. The conductive pattern CS may extend to cover a top surface of the data storage layer DA. The isolation pattern 176 may extend between the channel structures VS adjacent in x-axis direction.

The conductive pattern CS may include a semiconductor pattern 133 contacting the substrate 100, a first conductive layer 163 contacting and surrounding an upper portion of an outer sidewall of the semiconductor pattern 133, and a second conductive layer 161 contacting an upper portion of an inner sidewall of the semiconductor pattern 133. The semiconductor pattern 133 may include a spacer 131 and a semiconductor layer 132. The spacer 131 may be provided on the inner sidewall of the data storage layer DA, and the semiconductor layer 132 may downwardly extend to penetrate the data storage layer DA and to contact the substrate 100. In some embodiments, the spacer 131 may include at least one of a silicon material, a germanium material and a silicon-germanium material. Similarly, the semiconductor layer 132 may include at least one of a silicon material, a germanium material and a silicon-germanium material.

The first conductive layer 163 may be provided on a top surface of the data storage layer DA. For example, a bottom surface of the first conductive layer 163 may directly contact the top surface of the data storage layer DA. The first conductive layer 163 may be disposed along the outer sidewall of the semiconductor pattern 133. The first conductive layer 163 may be vertically aligned with the data storage layer DA. For example, an inner sidewall of the first conductive layer 163 may be vertically aligned with an inner sidewall of the data storage layer DA. That is, an inner sidewall of the first conductive layer 163 and an inner sidewall of the data storage layer DA may be aligned to contact the outer sidewall of the semiconductor pattern 133. Further, an outer sidewall of the first conductive layer 163 may be vertically aligned with an outer sidewall of the data storage layer DA.

The first conductive layer 163 may include a doped semiconductor material. For example, the first conductive layer 163 may include at least one of silicon, germanium and silicon-germanium. In some embodiments, the first conductive layer 163 may be formed of the same material as the second conductive layer 161.

The second conductive layer 161 may be disposed on the filling insulation pattern 172 and may be in contact with the inner sidewall of the semiconductor pattern 133. That is, the filling insulation pattern 172 may occupy a lower portion of a gap region surrounded by the inner sidewall of the semiconductor pattern 133, and the second conductive layer 161 may occupy an upper portion of the gap region surrounded by the inner sidewall of the semiconductor pattern 133.

The filling insulation pattern 172 may include at least one of a silicon oxide layer and a silicon oxynitride layer. The second conductive layer 161 may include a semiconductor material. For example, the second conductive layer 161 may include the same material as the semiconductor pattern 133. Alternatively, the second conductive layer 161 may include metal. For example, the second conductive layer 161 may include at least one of tungsten (W), titanium (Ti), aluminum (Al), tungsten nitride (WN), titanium nitride (TiN) and aluminum nitride (AlN). Conductive lines 198 may be disposed on the channel structures VS. The conductive lines 198 may be electrically connected to the channel structures VS through contact plugs 199.

FIGS. 20 to 23 are cross sectional views illustrating methods of forming semiconductor memory devices according to another exemplary embodiment. For the purpose of simplification in explanation, the descriptions to the same components as illustrated in the previous embodiment will be omitted or mentioned briefly.

Figure 20:
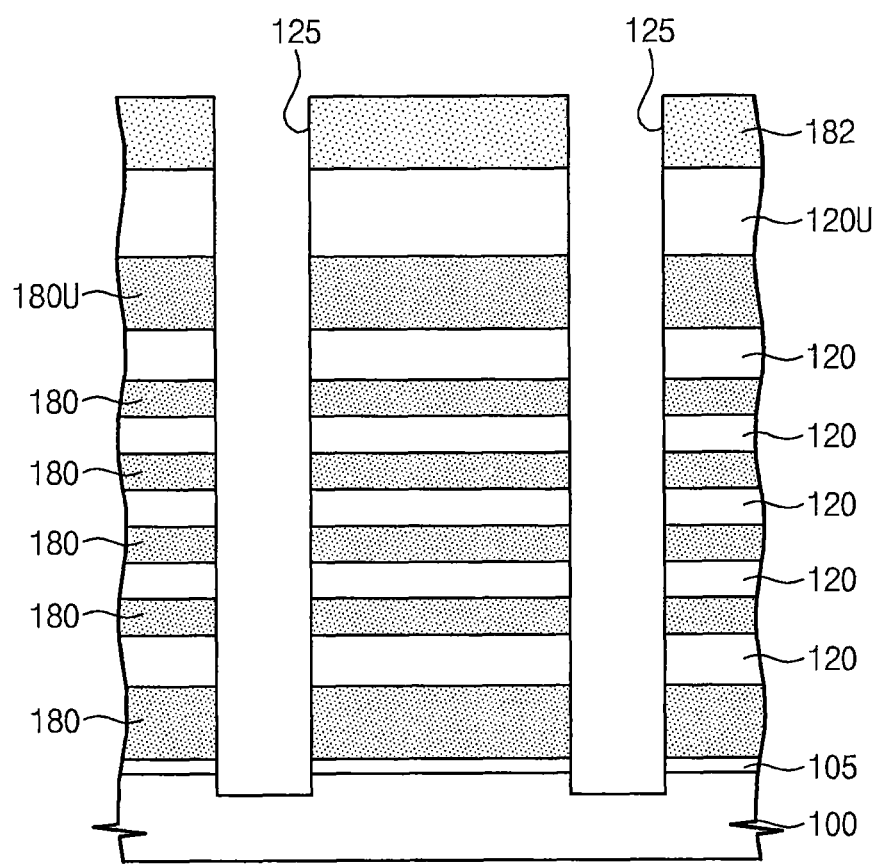
FIGS. 20 to 23 are cross sectional views relating to methods of forming semiconductor memory devices according to another exemplary embodiment.

Referring to FIG. 20, first material layers and second material layers different from the first materials may be alternately and repeatedly stacked on a substrate 100 to form a stacked structure. The first material layers may be electrode patterns 180 and 180U, and the second material layers may be insulation layers 120 and 120U. Each of the electrode patterns 180 and 180U may include at least one of a doped semiconductor layer, a metal layer, a conductive metal nitride layer and a metal silicide layer. A buffer insulation layer 105 may be formed between the lowermost layer among the electrode patterns 180 and 180U and the substrate 100.

A mask pattern 182 may be formed on the uppermost insulation layer 120U. The mask pattern 182 may be formed of a material having an etch selectivity with respect to the electrode patterns 180 and 180U and the insulation layers 120 and 120U. For example, when the electrode patterns 180 and 180U are formed of a silicon layer and the insulation layers 120 and 120U are formed of a silicon oxide layer, the mask pattern 182 may be formed of a material layer including a silicon nitride layer. The insulation layers 120 and 120U, the electrode patterns 180 and 180U and the buffer insulation layer 105 may be etched using the mask pattern 182 as an etch mask, thereby forming through holes 125 that expose the substrate 100.

Figure 21:
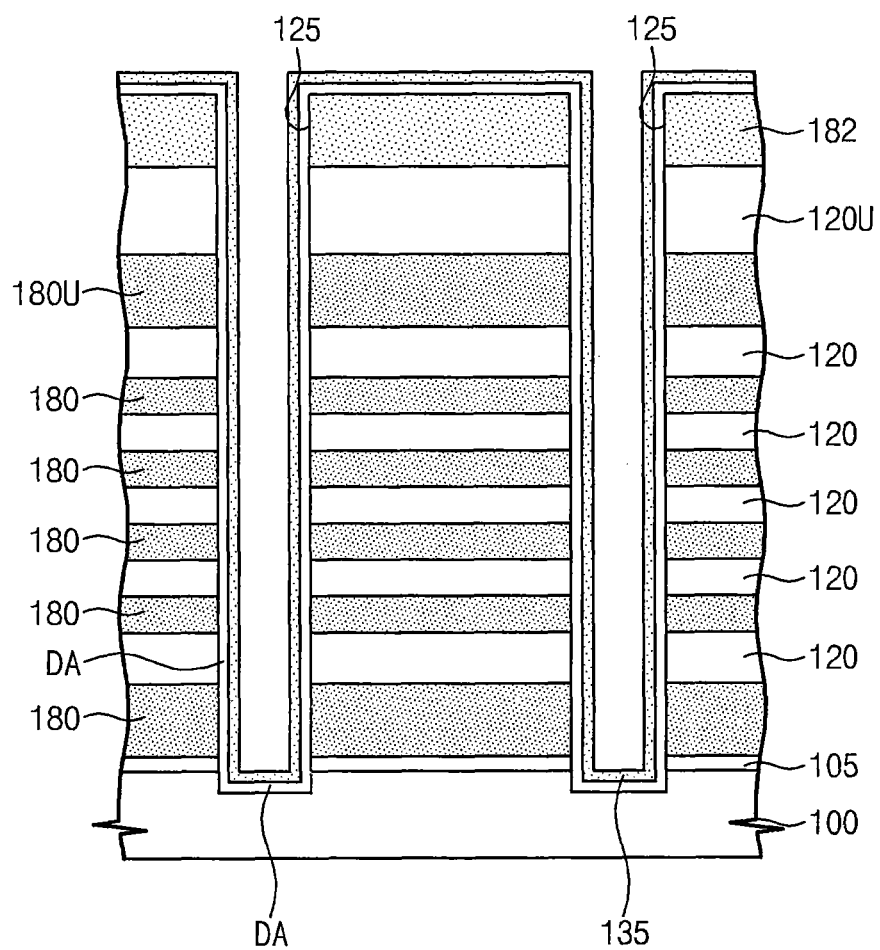

Referring to FIG. 21, a data storage layer DA and a spacer layer 135 may be sequentially formed on the substrate including the through holes 125. In some embodiments, the data storage layer DA and the spacer layer 135 may be conformally formed along inner surfaces of the through holes 125. The data storage layer DA may be formed to include a blocking insulation layer, a charge storage layer and a tunnel insulation layer that are sequentially stacked on the inner surfaces of the through holes 125, as illustrated FIG. 19.

Figure 22:
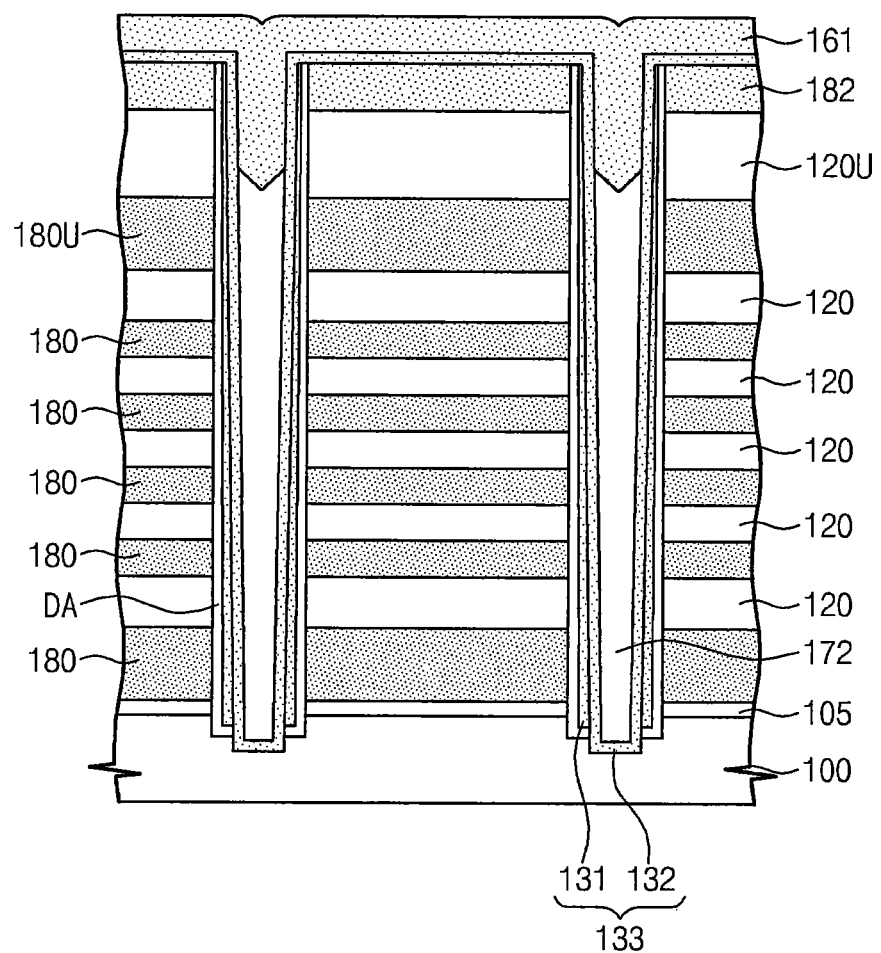

Referring to FIG. 22, the spacer layer 135 may be anisotropically etched to form spacers 131 in the through holes 125. The anisotropic etching process may be performed using plasma ions that vertically travel straight. While the spacers 131 are formed, the data storage layer DA may also be anisotropically etched to expose the substrate 100 in the through holes 125 and a top surface of the mask pattern 182. A semiconductor layer 132 and a filling insulation layer may be sequentially formed on the substrate including the spacers 131. The filling insulation layer may be partially removed to form filling insulation patterns 172 in respective ones of the through holes 125. In some embodiments, the filling insulation patterns 172 may be formed by planarizing the filling insulation layer and recessing the planarized filling insulation layer. The spacer 131 and the semiconductor layer 132 may constitute a semiconductor pattern 133.

A second conductive layer 161 may be formed on the substrate including the filling insulation patterns 172. The second conductive layer 161 may be in contact with the exposed inner sidewall of the semiconductor pattern 133 in each through hole 125. The second conductive layer 161 may be formed to include at least ones of a silicon material, a germanium material and a silicon-germanium material. In some embodiments, the second conductive layer 161 may be formed of the same material as the semiconductor pattern 133. Alternatively, the second conductive layer 161 may be formed of a metal layer. For example, the second conductive layer 161 may be formed to include at least one of tungsten (W), titanium (Ti), aluminum (Al), tungsten nitride (WN), titanium nitride (TiN) and aluminum nitride (AlN).

Figure 23:
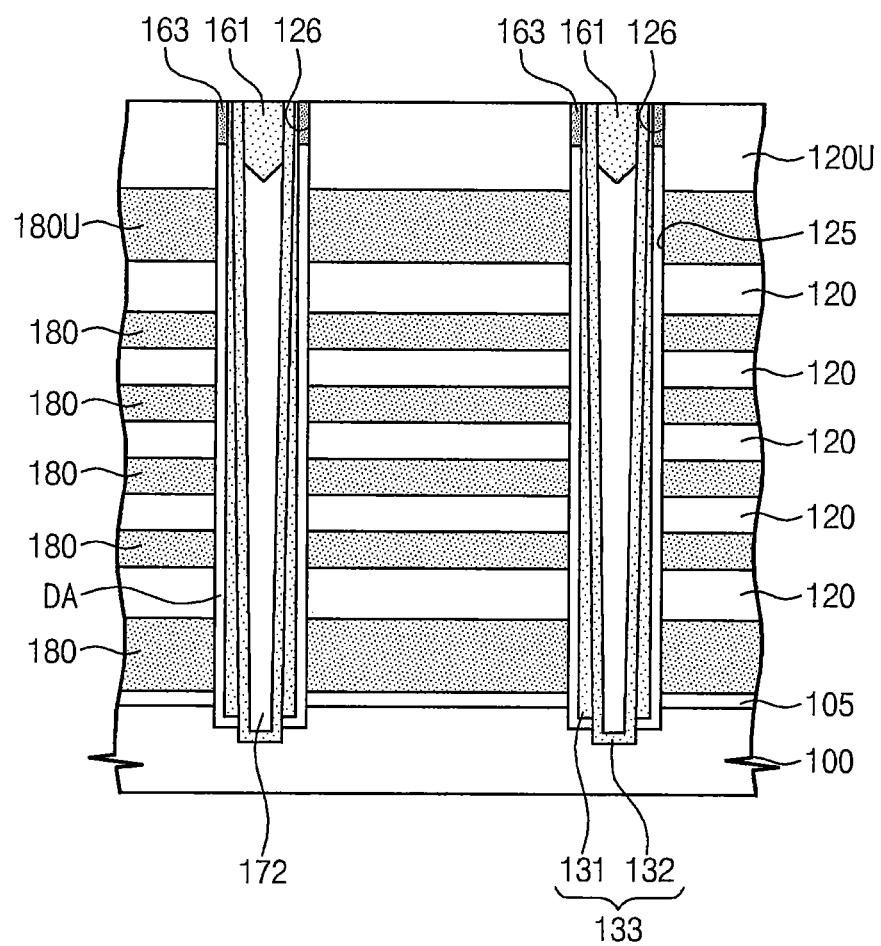

Referring to FIG. 23, the second conductive layer 161 and the semiconductor layer 132 may be planarized to expose the uppermost insulation layer 120U. The planarization process may separate the second conductive layer 161 into a plurality of second conductive layers 161 defined in respective ones of the through holes 125. Further, the planarization process may separate the semiconductor pattern 133 into a plurality of semiconductor patterns 133 defined in respective ones of the through holes 125. The planarization process may expose top surfaces of the data storage layers DA in respective ones of the through holes 125.

Upper portions of the data storage layers DA may be removed to form first recessed regions 126 in respective ones of the through holes 125. In some embodiments, when each of the data storage layers DA includes a blocking insulation layer, a charge storage layer and a tunnel insulation layer, the upper portions of the data storage layers DA may be removed by removing upper portions of the charge storage layers having an etch selectivity with respect to the uppermost insulation layer 120U to expose sidewalls of the blocking insulation layers and the tunnel insulation layers, and by removing upper portions of the blocking insulation layers and the tunnel insulation layers.

First conductive layers 163 may be formed in respective ones of the first recessed regions 126. The first conductive layers 163 may be formed by depositing a conductive layer on the substrate including the first recessed regions 126 and planarizing the conductive layer. The first and second conductive layers 163 and 161, the semiconductor pattern 133 and the filling insulation pattern 172 in each of the through holes 125 may constitute a channel structure (refer to VS in FIG. 18). In each of the through holes 125, the first conductive layer 163 may be formed to contact the top surface of the data storage layer DA and the sidewall of the semiconductor pattern 133. The first conductive layers 163 may be formed of a doped semiconductor material. For example, the first conductive layer 163 may be formed to include at least one of a silicon material, a germanium material and a silicon-germanium material.

Referring again to FIG. 18, the isolation pattern 176 may be formed between the upper selection gate patterns 180U adjacent each other in x-axis direction. For example, the isolation pattern 176 may be disposed in a trench (not shown) and the trench may be formed by etching the upper selection gate patterns 180U and the uppermost insulation layer 120U. Subsequently, conductive lines 198 may be formed on the channel structures VS, as illustrated in FIG. 18. The conductive lines 198 may be electrically connected to the channel structures VS through contact plugs 199.

The exemplary embodiment illustrated in FIG. 2 describes the first conductive layers as including metal, and the exemplary embodiment illustrated in FIG. 18 describes the first conductive layers as a semiconductor layer. However, the exemplary embodiments are not limited to the above descriptions. For example, the first conductive layers of the exemplary embodiment illustrated in FIG. 2 may include a semiconductor layer, and the first conductive layers of the exemplary embodiment illustrated in FIG. 18 may include metal.

Figure 24:
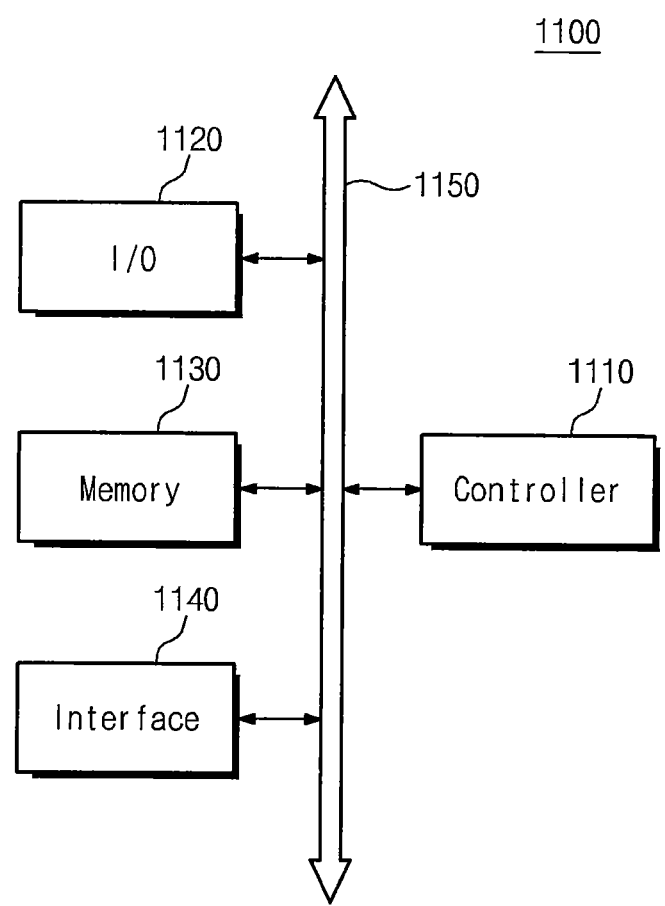
FIG. 24 is a schematic block diagram relating to an example of electronic systems including semiconductor memory devices according to some exemplary embodiments.

FIG. 24 is a schematic block diagram illustrating an example of electronic systems including semiconductor memory devices according to some exemplary embodiments.

Referring to FIG. 24, an electronic system 1100 may be applied to a personal digital assistant (PDA), a portable computer, a web tablet, a wireless phone, a mobile phone, a digital music player or a memory card. The electronic system 1100 may also be applied to another electronic product that receives or transmits information data by wireless.

The electronic system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. That is, the data bus 1150 may correspond to a path through which electrical signals are transmitted.

The controller 1110 may include at least one of a microprocessor, a digital signal processor (DSP), a microcontroller and the like. The memory device 1130 may store commands executed by the controller 1110. The I/O unit 1120 may receive data or signals from an external device or may transmit data or signals to the external device. The I/O unit 1120 may include a keypad, a keyboard or a display unit.

The memory device 1130 may include at least one of the semiconductor memory devices according to the exemplary embodiments described above. Alternatively, the memory device 1130 may include another type of semiconductor memory device which is different from the semiconductor memory devices described in the above embodiments. For example, the memory device 1130 may include a magnetic memory device, a phase change memory device, a dynamic random access memory (DRAM) device and/or a static random access memory (SRAM) device. The interface unit 1140 may transmit electrical data to a communication network or may receive electrical data from the communication network.

Figure 25:
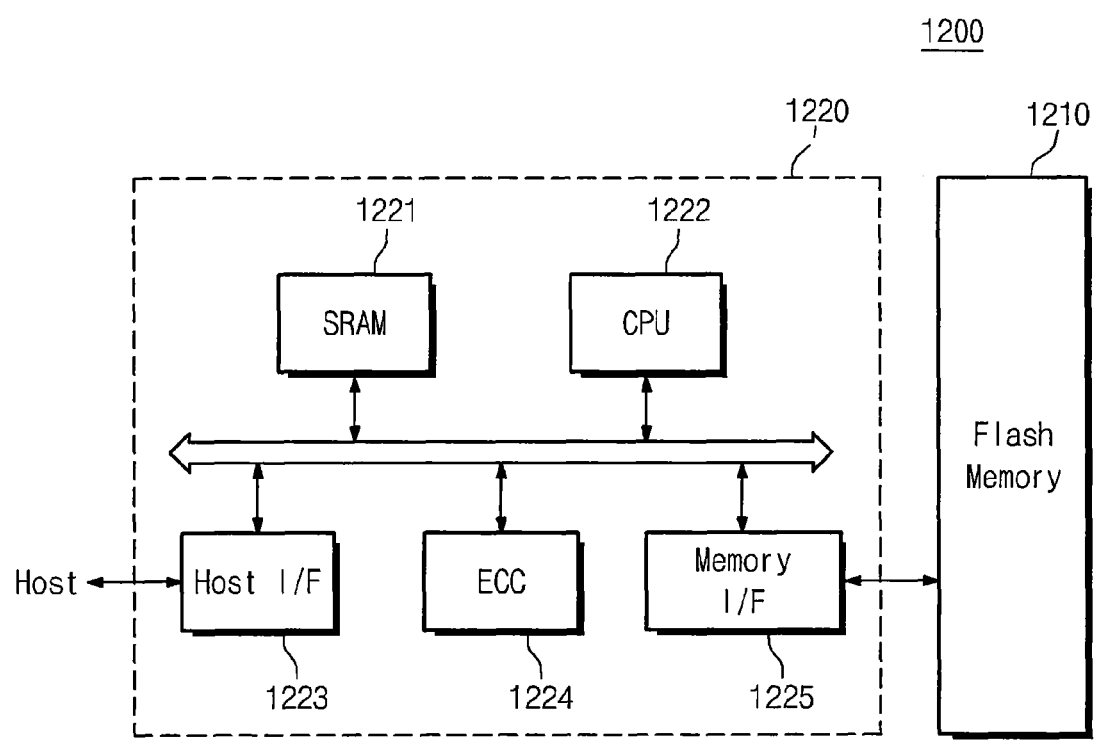
FIG. 25 is a schematic block diagram relating to memory cards including semiconductor memory devices according to some exemplary embodiments.

FIG. 25 is a schematic block diagram illustrating memory cards including the semiconductor devices according to the exemplary embodiments.

Referring to FIG. 25, a memory card 1200 may include a flash memory device 1210 having at least one of the semiconductor memory devices according to the exemplary embodiments described above. The memory card 1200 may be used as a data storage media for storing a large capacity of data. The memory card 1200 may further include a memory controller 1220 that controls data communication between a host and the flash memory device 1210.

The memory controller 1220 may include a static random access memory (SRAM) device 1221, a central processing unit (CPU) 1222, a host interface unit 1223, an error check and correction (ECC) block 1224 and a memory interface unit 1225. The SRAM device 1221 may be used as an operation memory of the CPU 1222. The host interface unit 1223 may be configured to include a data communication protocol between the memory card 1200 and the host. The ECC block 1224 may detect and correct errors of data which are read out from the flash memory device 1210. The memory interface unit 1225 may connect the memory controller 1220 to the flash memory device 1210. The central processing unit (CPU) 1222 may control overall operations for data communication of the memory controller 1220. The memory card 1200 may further include a read only memory (ROM) device that stores code data to interface with the host.

Figure 26:
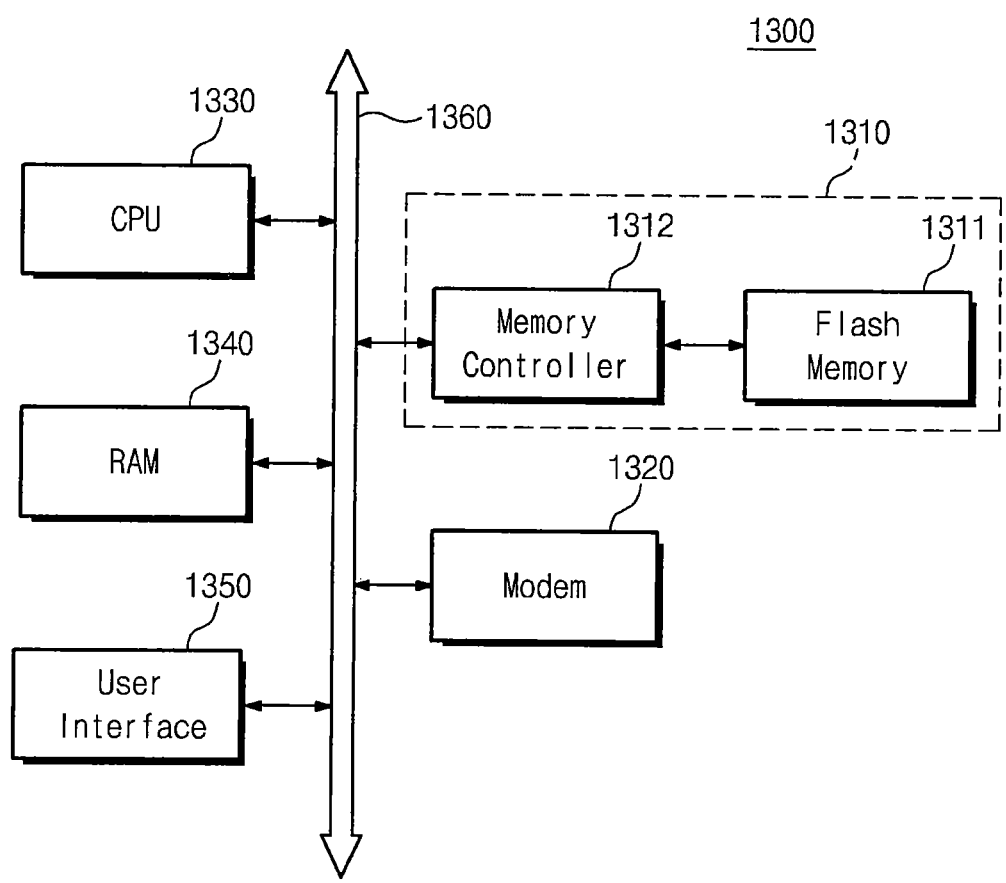
FIG. 26 is a schematic block diagram relating to information processing systems including semiconductor memory devices according to some exemplary embodiments.

FIG. 26 is a block diagram illustrating information processing systems including the semiconductor devices according to the exemplary embodiments.

Referring to FIG. 26, an information processing system 1300 may be a mobile system, a desk top computer or the like. The information processing system 1300 may include a flash memory unit 1310 having at least one of the flash memory devices according to the exemplary embodiments described above. The information processing system 1300 may further include a modulator-demodulator (MODEM) 1320, a central processing unit (CPU) 1330, a random access memory (RAM) device 1340 and a user interface unit 1350. At least two of the flash memory unit 1310, the MODEM 1320, the CPU 1330, the RAM device 1340 and the user interface unit 1350 may communicate with each other through a data bus 1360. The flash memory unit 1310 may have substantially the same configuration as the memory card 1200 illustrated in FIG. 25. That is, the flash memory unit 1310 may include a flash memory device 1311 and a memory controller 1312 that controls overall operations of the flash memory device 1311.

The flash memory unit 1310 may store data processed by the CPU 1330 or data transmitted from an external system. The flash memory unit 1310 may be configured to include a solid state disk. In this case, the information processing system 1300 may stably and reliably store the flash memory unit 1310 with a large capacity of data. If the reliability of the flash memory unit 1310 is improved, the information processing system 1300 may save sources that are required to check and correct data. As a result, the information processing system 1300 may provide fast data communication. The information processing system 1300 may further include a camera image processor, an application chipset and/or an input/output unit.

The semiconductor memory devices according to the exemplary embodiments described above may be encapsulated using various packaging techniques. For example, the semiconductor memory devices according to the aforementioned exemplary embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique.

According to the embodiments set forth above, an alignment margin between channel structures and contact plugs formed on the channel structures can be improved even without substantial reduction of a distance between the channel structures.

While the embodiments have been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a semiconductor memory device, the method comprising:
   alternately stacking first material layers and second material layers on a substrate to form a stacked structure;
   forming a through hole penetrating the stacked structure;
   forming a data storage layer on a sidewall of the through hole;
   forming a semiconductor pattern electrically connected to the substrate on an inner sidewall of the data storage layer;
   etching an upper portion of the data storage layer to form a first recessed region exposing an outer sidewall of the semiconductor pattern; and
   forming a first conductive layer in the first recessed region, wherein the data storage layer is formed to include a first layer and a second layer that have an etch selectivity with respect to each other, and wherein etching the upper portion of the data storage layer includes:
selectively removing an upper portion of the first layer to form a second recessed region exposing a sidewall of the second layer; and
etching an upper portion of the second layer to expose the outer sidewall of the semiconductor pattern.

2. The method of claim 1, wherein each of the second material layers include a silicon oxide layer, and the first layer has an etch selectivity with respect to the second material layers.

3. The method of claim 1, further comprising replacing the first material layers with electrode patterns,
wherein etching the upper portion of the data storage layer is performed so that a top surface of the data storage layer, having been etched, is located at a higher level than a top surface of an uppermost one of the electrode patterns.

4. The method of claim 1, wherein the first conductive layer comprises metal.

5. The method of claim 1, further comprising:
forming a filling insulation layer that fills the through hole surrounded by the semiconductor pattern;
etching an upper portion of the filling insulation layer to form a third recessed region in the through hole; and
forming a second conductive layer in the third recessed region.

6. The method of claim 5, wherein the second conductive layer is formed prior to formation of the first conductive layer.

7. The method of claim 1, wherein forming the data storage layer includes sequentially forming a tunnel insulation layer, a charge storage layer and a blocking insulation layer on a sidewall of the through hole, and
wherein etching the upper portion of the data storage layer includes:
selectively etching an upper portion of the charge storage layer to expose sidewalls of the tunnel insulation layer and the blocking insulation layer; and
removing upper portions of the tunnel insulation layer and the blocking insulation layer.

8. A method of fabricating a semiconductor memory device, the method comprising:
alternately stacking first material layers and second material layers on a substrate to form a stacked structure;
forming a through hole penetrating the stacked structure;
forming a data storage layer on a sidewall of the through hole;
forming a semiconductor pattern electrically connected to the substrate on an inner sidewall of the data storage layer;
etching an upper portion of the data storage layer to form a first recessed region exposing an outer sidewall of the semiconductor pattern; and
forming a first conductive layer in the first recessed region on the data storage layer so that the first conductive layer surrounds the outer sidewall of the semiconductor pattern.

9. The method of claim 8, wherein the data storage layer is formed to include a first layer and a second layer that have an etch selectivity with respect to each other, and
wherein etching the upper portion of the data storage layer includes:
selectively removing an upper portion of the first layer to form a second recessed region exposing a sidewall of the second layer; and
etching an upper portion of the second layer to expose the outer sidewall of the semiconductor pattern.

10. The method of claim 9, wherein each of the second material layers include a silicon oxide layer, and the first layer has an etch selectivity with respect to the second material layers.

11. The method of claim 8, further comprising replacing the first material layers with electrode patterns,
wherein etching the upper portion of the data storage layer is performed so that a top surface of the data storage layer, having been etched, is located at a higher level than a top surface of an uppermost one of the electrode patterns.

12. The method of claim 8, wherein the first conductive layer comprises metal.

13. The method of claim 8, further comprising:
forming a filling insulation layer that fills the through hole surrounded by the semiconductor pattern;
etching an upper portion of the filling insulation layer to form a third recessed region in the through hole; and
forming a second conductive layer in the third recessed region.

14. The method of claim 13, wherein the second conductive layer is formed prior to formation of the first conductive layer.

15. The method of claim 8, wherein forming the data storage layer includes sequentially forming a tunnel insulation layer, a charge storage layer and a blocking insulation layer on a sidewall of the through hole, and
wherein etching the upper portion of the data storage layer includes:
selectively etching an upper portion of the charge storage layer to expose sidewalls of the tunnel insulation layer and the blocking insulation layer; and
removing upper portions of the tunnel insulation layer and the blocking insulation layer.

* * * * *